US005774379A

United States Patent [19]

Gross et al.

[11] Patent Number: 5,774,379

[45] Date of Patent: Jun. 30, 1998

[54] SYSTEM FOR MONITORING AN INDUSTRIAL OR BIOLOGICAL PROCESS

[75] Inventors: Kenneth C. Gross; Stephan W. Wegerich; Rick B. Vilim, all of Argonne; Andrew M. White, Skokie, all of Ill.

[73] Assignee: The University of Chicago, Chicago, Ill.

[21] Appl. No.: 505,453

[22] Filed: Jul. 21, 1995

[51] Int. Cl.[6] .................... G01R 17/00

[52] U.S. Cl. .................... 364/576; 364/487

[58] Field of Search .................... 364/576, 551.01, 364/554, 480, 413.01, 413.03, 413.05, 413.06, 485, 486, 487, 569, 421; 128/633; 607/115

[56] References Cited

U.S. PATENT DOCUMENTS

| | | | |
|---|---|---|---|
| 3,696,414 | 10/1972 | Allen et al. . | |
| 4,747,054 | 5/1988 | Chittineni | 364/421 |
| 5,285,784 | 2/1994 | Seeker | 128/633 |
| 5,443,489 | 8/1995 | Ben-Haim | 607/115 |

*Primary Examiner*—Emanuel T. Voeltz
*Assistant Examiner*—M. Kemper
*Attorney, Agent, or Firm*—Michael D. Rechtin; Foley & Lardner

[57] ABSTRACT

A method and apparatus for monitoring and responding to conditions of an industrial process. Industrial process signals, such as repetitive manufacturing, testing and operational machine signals, are generated by a system. Sensor signals characteristic of the process are generated over a time length and compared to reference signals over the time length. The industrial signals are adjusted over the time length relative to the reference signals, the phase shift of the industrial signals is optimized to the reference signals and the resulting signals output for analysis by systems such as SPRT.

16 Claims, 20 Drawing Sheets

$\underline{x}$=[x(1)x(2).....x(N)]:INPUT SIGNAL
$L_r$:REFERENCE LENGTH
$T_s$:SIGNAL EXTRACTION THRESHOLD (START)
$T_e$:SIGNAL EXTRACTION THRESHOLD (END)
M:INTERPOLATION METHOD
(F)FFT,(L)LINEAR,(S)SPLINE $n_s$:SIGNAL START SAMPLE
$n_e$:SIGNAL END SAMPLE
$\underline{z}$=[z(1)z(2).....z($L_r$)]: OUTPUT

SYSTEM FOR MONITORING AN INDUSTRIAL OR BIOLOGICAL PROCESS

The United States Government has rights in this invention pursuant to Contract W-31-109-ENG-38 between the U.S. Department of Energy and the University of Chicago.

The present invention is concerned generally with a system and method for reliably monitoring industrial or biological processes having nonwhite noise characteristics. More particularly, the invention is concerned with an apparatus and method for pattern recognition and signal processing for industrial and biological systems characterized by repetitive events. In addition, the invention is concerned with an apparatus and method for monitoring sensor signals associated with repetitive events to ascertain the reliability of sensors and operating state of an industrial process. Further, the sensor signals can be corrected enabling meaningful comparison with reference signals characteristic of a desired operating state. In another aspect, the invention is concerned with a system and method for removal of nonwhite noise elements or serially correlated noise, allowing reliable supervision of an industrial or biological process and/or operability of sensors monitoring the process.

Virtually all monitoring systems utilize sensors which undergo change over time of use and can thus become less reliable sources of information with regard to the properness of the operating state of the industrial or biological system being monitored. In a variety of important sensor systems, the monitoring is concerned with repetitive events including, for example, cardiac signals, aircraft engine operation, industrial product manufacture, nondestructive testing of products or chemical processing methods. Typically, simplistic approaches are taken to evaluate whether the monitoring system is properly identifying a normal or abnormal operating state. Such techniques can include visual inspection of industrial mechanical monitors (whether they are "worn" or not) or establishing an electrical parameter threshold value below which the monitor is deemed to be worn out, such as generating no output at all. Such conventional methodologies cannot account for many complex operating conditions and variables encountered in typical industrial and biological processes.

In a further aspect of the invention, conventional parameter-surveillance schemes are sensitive only to gross changes in the mean value of a process, or to large steps or spikes that exceed some threshold limit check. These conventional methods suffer from either large numbers of false alarms (if thresholds are set too close to normal operating levels) or a large number of missed (or delayed) alarms (if the thresholds are set too expansively). Moreover, most conventional methods cannot perceive the onset of a process disturbance or sensor deviation which generates a signal which is either below the threshold level, or outside a reference signal signature, giving rise to an alarm condition.

In another conventional monitoring method, the Sequential Probability Ratio Test ("SPRT") has found wide application as a signal validation tool in the nuclear reactor industry. Two features of the SPRT technique make it attractive for parameter surveillance and fault detection: (1) early annunciation of the onset of a disturbance in noisy process variables, and (2) the SPRT technique has user-specifiable false-alarm and missed-alarm probabilities. One important drawback of the SPRT technique that has limited its adaptation to a broader range of nuclear applications is the fact that its mathematical formalism is founded upon an assumption that the signals it is monitoring are purely Gaussian, independent (white noise) random variables.

It is therefore an object of the invention to provide an improved method and system for evaluation and/or modification of industrial or biological processes and/or the sensors monitoring the processes.

It is also an object of the invention to provide an improved apparatus and method for insuring reliable monitoring of systems and processes characterizable by repetitive events.

It is an additional object of the invention to provide a novel apparatus and method for normalization of measured signals relative to an accepted reference signal, enabling meaningful analysis of operating signals.

It is still a further object of the invention to provide an improved apparatus and method for adjusting the length and phase of a measured signal relative to an accepted reference signal, enabling detection of abnormalities in the sensor and/or system being monitored.

It is yet another object of the invention to provide a novel apparatus and method to adjust the variable length and/or phase of a measured signal arising from a sensor, or potentially the monitored system, undergoing wear in order to accurately assess the operating status of a system or acceptability of a product.

It is another object of the invention to provide a novel method and system for statistically processing industrial process signals having virtually any form of noise signal.

It is a further object of the invention to provide an improved method and system for operating on an industrial process signal to remove unwanted serially correlated noise signals.

It is still an additional object of the invention to provide a novel method and system utilizing a pair of signals to generate a difference function to be analyzed for alarm information.

It is still a further object of the invention to provide an improved method and system including at least one sensor for providing a real signal characteristic of a process and a predicted sensor signal allowing formation of a difference signal between the predicted and real signal for subsequent analysis free from nonwhite noise contamination.

It is also an object of the invention to provide a novel method and system wherein a difference function is formed from two sensor signals, and/or pairs of signals and nonwhite noise is removed enabling reliable alarm analysis of the sensor signals.

It is yet an additional object of the invention to provide an improved method and system utilizing variable pairs of sensors for determining both sensor degradation and industrial process status.

Other objects, features and advantages of the present invention will be readily apparent from the following description of the preferred embodiments thereof, taken in conjunction with the accompanying drawings described below.

DETAILED DESCRIPTION OF PREFERRED EMBODIMENTS

Figure 1:
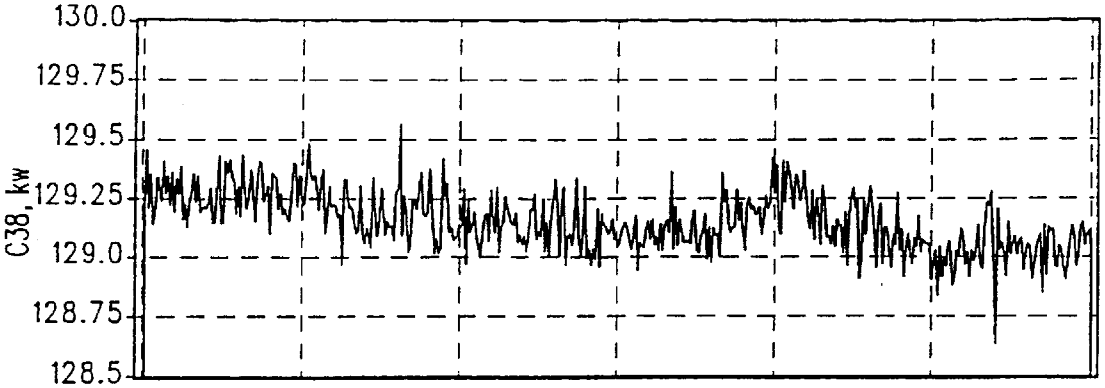
FIG. 1 illustrates the specified output of a pump's power output over time.

In one of the methods of the invention, signals from industrial (or biological) process sensors (hereinafter, "industrial sensors") can be used to modify or terminate degrading or anomalous processes. The sensor signals are manipulated to provide input data to a statistical analysis technique, such as a process entitled Spectrum Transformed Sequential Testing ("SPRT"). Details of this process and the invention therein are disclosed in U.S. Pat. application No. 07/827,776 now U.S. Pat. No. 5,223,207 which is incorporated by reference herein in its entirety. A further illustration of the use of SPRT for analysis of data bases is set forth in the copending application filed contemporaneously, entitled "Processing Data Base Information Having Nonwhite Noise," also incorporated by reference herein in its entirety (U.S. Pat. application No. 08/068,712) now U.S. Pat. No. 5,410,492. The procedures followed in a preferred method are shown generally in FIG. 8. In performing such a preferred analysis of the sensor signals, a dual transformation method is performed, insofar as it entails both a frequency-domain transformation of the original time-series data and a subsequent time-domain transformation of the resultant data. The data stream that passes through the dual frequency-domain, time-domain transformation is then processed with the SPRT procedure, which uses a log-likelihood ratio test. A computer software Appendix A is also attached hereto covering the SPRT procedure and its implementation in the context of, and modified by, the instant invention.

In the preferred embodiment, successive data observations are performed on a discrete process Y, which represents a comparison of the stochastic components of physical processes monitored by a sensor, and most preferably pairs of sensors. In practice, the Y function is obtained by simply differencing the digitized signals from two respective sensors. Let $y_k$ represent a sample from the process Y at time $t_k$. During normal operation with an undegraded physical system and with sensors that are functioning within specifications the $y_k$ should be normally distributed with mean of zero. Note that if the two signals being compared do not have the same nominal mean values (due, for example, to differences in calibration), then the input signals will be pre-normalized to the same nominal mean values during initial operation.

In performing the monitoring of industrial processes, the system's purpose is to declare a first system or a second system degraded if the drift in Y is sufficiently large that the sequence of observations appears to be distributed about a mean+M or−M, where M is our pre-assigned system-disturbance magnitude. We would like to devise a quantitative framework that enables us to decide between two hypotheses, namely:

$H_1$: Y is drawn from a Gaussian probability distribution function ("PDF") with mean M and variance $\sigma^2$.

$H_2$: Y is drawn from a Gaussian PDF with mean 0 and variance $\sigma^2$.

We will suppose that if $H_1$ or $H_2$ is true, we wish to decide for $H_1$ or $H_2$ with probability (1-$\beta$) or (1-$\alpha$), respectively, where $\alpha$ and $\beta$ represent the error (misidentification) probabilities.

From the conventional, well known theory of Wald, the test depends on the likelihood ratio $1_n$ , where $$l_n = \frac{\text{The probability of observed sequence } y_1, y_2 \ldots, y_n \text{ given } H_1 \text{ true}}{\text{The probability of observed sequence } y_1, y_2 \ldots, y_n \text{ given } H_2 \text{ true}} \quad (1)$$

After "n" observations have been made, the sequential probability ratio is just the product of the probability ratios for each step:

$$1n=(PR_1)\bullet(PR_2)\bullet \ldots \bullet(PR_n) \quad (2)$$

or $$l_n = \prod_{l=1}^{1=n} \frac{f(y_1|H_1)}{f(y_1|H_2)} \quad (3)$$

where f(y|H) is the distribution of the random variable y.

Wald's theory operates as follows: Continue sampling as long as $A<1_n<B$. Stop sampling and decide $H_1$ as soon as $1_n \geqq B$, and stop sampling and decide $H_2$ as soon as $1_n \leqq A$. The acceptance thresholds are related to the error (misidentification) probabilities by the following expressions:

$$A = \frac{\beta}{1-\alpha}\text{, and } B = \frac{1-\beta}{\alpha} \quad (4)$$

The (user specified) value of $\alpha$ is the probability of accepting $H_1$ when $H_2$ is true (false alarm probability). $\beta$ is the probability of accepting $H_2$ when $H_1$ is true (missed alarm proability).

If we can assume that the random variable $y_k$ is normally distributed, then the likelihood that $H_1$ is true (i.e., mean M, variance $\sigma^2$) is given by:

$$L(y_1, y_2 \ldots, y_n|H_1) = \frac{1}{(2\pi)^{n/2}\sigma^n} \exp\left[-\frac{1}{2\sigma^2}\left(\sum_{k=1}^{n} y_k^2 - 2\sum_{k=1}^{n} y_k M + \sum_{k=1}^{n} M^2\right)\right] \quad (5)$$

Similarly for $H_2$ (mean 0, variance $\sigma^2$):

$$L(y_1, y_2 \ldots, y_n|H_2) = \frac{1}{(2\pi)^{n/2}\sigma^n} \exp\left(-\frac{1}{2\sigma^2}\sum_{k=1}^{n} y_k^2\right) \quad (6)$$

The ratio of (5) and (6) gives the likelihood ratio $\mathbf{1}_n$ $$l_n = \exp\left[-\frac{-1}{2\sigma^2}\sum_{k=1}^{n} M(M-2y_k)\right] \quad (7)$$

Combining (4) and (7), and taking natural logs gives $$\ln\frac{\beta}{1-\alpha} < \frac{-1}{2\sigma^2}\sum_{k=1}^{n} M(M-2y_k) < \ln\frac{(1-\beta)}{\alpha} \quad (8)$$

Our sequential sampling and decision strategy can be concisely represented as:

$$\text{If } l_n \leqq \ln\frac{\beta}{1-\alpha}\text{, Accept } H_2 \quad (9)$$

$$\text{If } \ln\frac{\beta}{1-\alpha} < l_n < \ln\frac{1-\beta}{\alpha}\text{, Continue Sampling} \quad (10)$$

$$\text{And if } l_n \geqq \ln\frac{1-\beta}{\alpha}\text{, Accept } H_1 \quad (11)$$

Following Wald's sequential analysis, it is conventional that a decision test based on the log likelihood ratio has an optimal property; that is, for given probabilities $\alpha$ and $\beta$ there is no other procedure with at least as low error probabilities or expected risk and with shorter length average sampling time.

A primary limitation that has heretofore precluded the applicability of Wald-type binary hypothesis tests for sensor and equipment surveillance strategies lies in the primary assumption upon which Wald's theory is predicated; that the original process Y is strictly "white" noise, independently-distributed random data. White noise is thus well known to be a signal which is uncorrelated. Such white noise can, for example, include Gaussian noise. It is, however, very rare to find physical process variables associated with operating machinery that are not contaminated with serially-correlated, deterministic noise components. Serially correlated noise components are conventionally known to be signal data whose successive time point values are dependent on one another. Noise components include for example, auto-correlated (also known as serially correlated) noise and Markov dependent noise. Auto-correlated noise is a known form of noise wherein pairs of correlation coefficients describe the time series correlation of various data signal values along the time series of data. That is, the data $U_1$, $U_2$, . . . , $U_n$ have correlation coefficients $(U_1, U_2)$, $(U_2, U_3)$, . . . , $(U_n\mathbf{-1}, U_n)$ and likewise have correlation coefficients $(U_1, U_3)$, $(U_2, U_4)$, etc. If these data are auto-correlated, at least some of the coefficients are non-zero. Markov dependent noise on the other hand is a very special form of correlation between past and future data signals. Rather, given the value of $U_k$, the values of $U_n$, n>k, do not depend on the values of Uj where j>k. This implies the correlation pairs $(U_j, U_n)$ given the value $U_k$, are all zero. If, however, the present value is imprecise, then the correlation coefficients may be nonzero. This invention can overcome this limitation to conventional surveillance strategies by integrating the Wald sequential-test approach with a new dual transformation technique. This symbiotic combination of frequency-domain transformations and time-domain transformations produces a tractable solution to a particularly difficult problem that has plagued signal- processing specialists for many years.

Figure 8A:
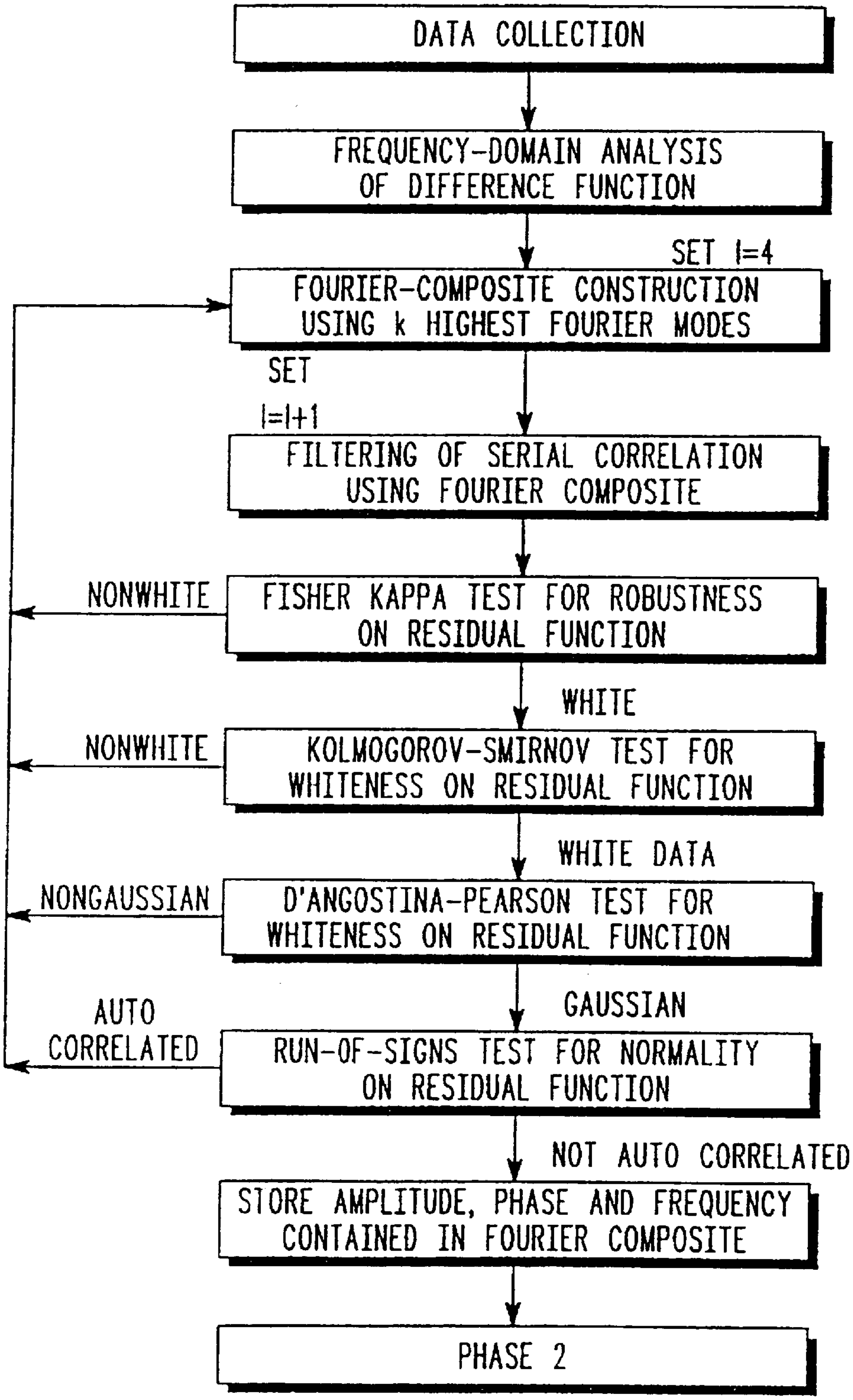
FIG. 8A and 8B illustrate a schematic functional flow diagram of the invention with FIG. 8A showing a first phase of the method of the invention and FIG. 8B shows the application of the method of the invention.
Figure 8B:
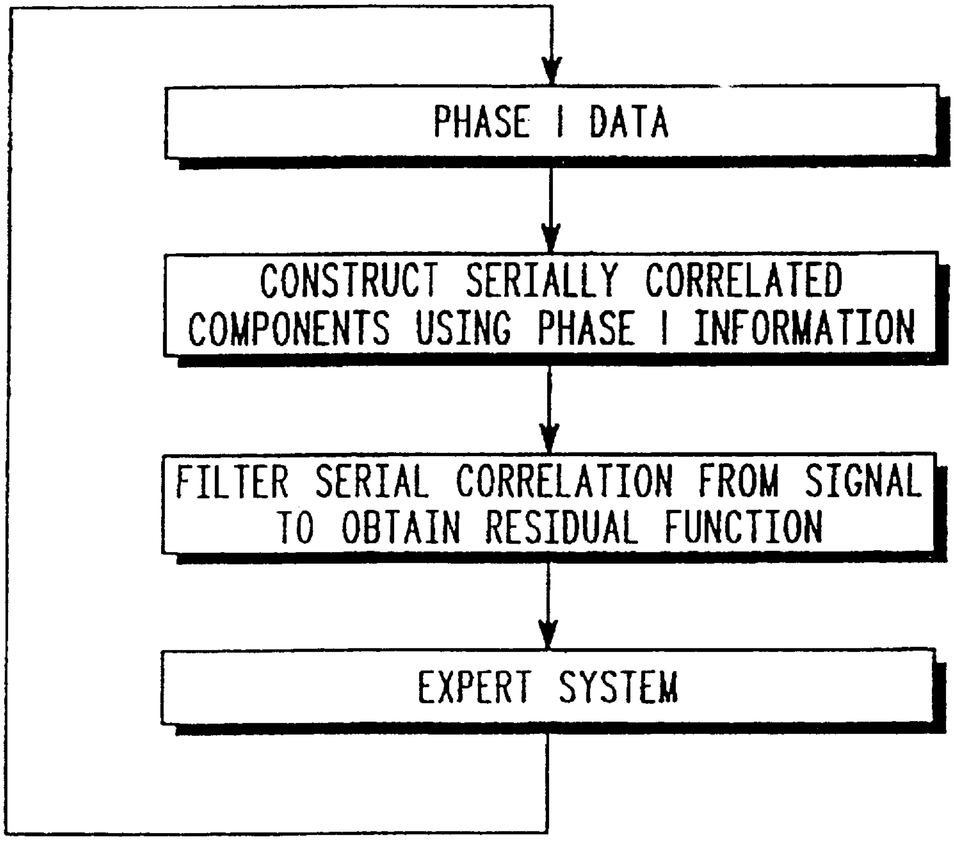

In the preferred embodiment of the method shown in detail in FIG. 8, serially-correlated data signals from an industrial process can be rendered amenable to the SPRT testing methodology described hereinbefore. This is preferably done by performing a frequency-domain transformation of the original difference function Y. A particularly preferred method of such a frequency transformation is accomplished by generating a Fourier series using a set of highest "1" number of modes. Other procedures for rendering the data amenable to SPRT methods includes, for example, auto regressive techniques, which can accomplish substantially similar results described herein for Fourier analysis. In the preferred approach of Fourier analysis to determine the "1" highest modes (see FIG. 8A):

$$Y_t = \frac{a_0}{2} + \sum_{m=1}^{\frac{N}{2}} (a_m\cos\omega_m t + b_m\sin\omega_m t) \quad (12)$$

where $a_0/2$ is the mean value of the series, $a_m$ and $b_m$ are the Fourier coefficients corresponding to the Fourier frequency $\omega_m$, and N is the total number of observations. Using the Fourier coefficients, we next generate a composite function, $X_t$, using the values of the largest harmonics identified in the Fourier transformation of $Y_t$. The following numerical approximation to the Fourier transform is useful in determining the Fourier coefficients $a_m$ and $b_m$. Let $X_j$ be the value of $X_t$ at the jth time increment. Then assuming $2\pi$ periodicity and letting $\omega_m=2\pi m/N$, the approximation to the Fourier transform yields:

$$a_m = \frac{2}{N} \sum_{j=0}^{N-1} x_j \cos\omega_m j \qquad b_m = \frac{2}{N} \sum_{j=0}^{N-1} x_j \sin\omega_m j \tag{13}$$

for 0<m<N/2. Furthermore, the power spectral density ("PSD") function for the signal is given by $1_m$ where $$l_m = N \frac{a_m^2 + b_m^2}{2} \tag{14}$$

To keep the signal bandwidth as narrow as possible without distorting the PSD, no spectral windows or smoothing are used in our implementation of the frequency-domain transformation. In analysis of a pumping system of the EBR-II reactor of Argonne National Laboratory, the Fourier modes corresponding to the eight highest $1_m$ provide the amplitudes and frequencies contained in $X_t$. In our investigations for the particular pumping system data taken, the highest eight $1_m$ modes were found to give an accurate reconstruction of $X_t$ while reducing most of the serial correlation for the physical variables we have studied. In other industrial processes, the analysis could result in more or fewer modes being needed to accurately construct the functional behavior of a composite curve. Therefore, the number of modes used is a variable which is iterated to minimize the degree of nonwhite noise for any given application. As noted in FIG. 8A a variety of noise tests are applied in order to remove serially correlated noise.

The reconstruction of $X_t$ uses the general form of Eqn. (12), where the coefficients and frequencies employed are those associated with the eight highest PSD values. This yields a Fourier composite curve (see end of flowchart in FIG. 8A) with essentially the same correlation structure and the same mean as $Y_t$. Finally, we generate a discrete residual function $R_t$ by differencing corresponding values of $Y_t$ and $X_t$. This residual function, which is substantially devoid of serially correlated contamination, is then processed with the SPRT technique described hereinbefore.

In a specific example application of the above referenced methodology, certain variables were monitored from the Argonne National Laboratory reactor EBR-II. In particular, EBR-II reactor coolant pumps (RCPs) and delayed neutron (DN) monitoring systems were tested continuously to demonstrate the power and utility of the invention. The RCP and DN systems were chosen for initial application of the approach because SPRT-based techniques have already been under development for both the systems. All data used in this investigation were recorded during full-power, steady state operation at EBR-II. The data have been digitized at a 2-per-second sampling rate using $2^{14}$ (16,384) observations for each signal of interest.

Figure 2:
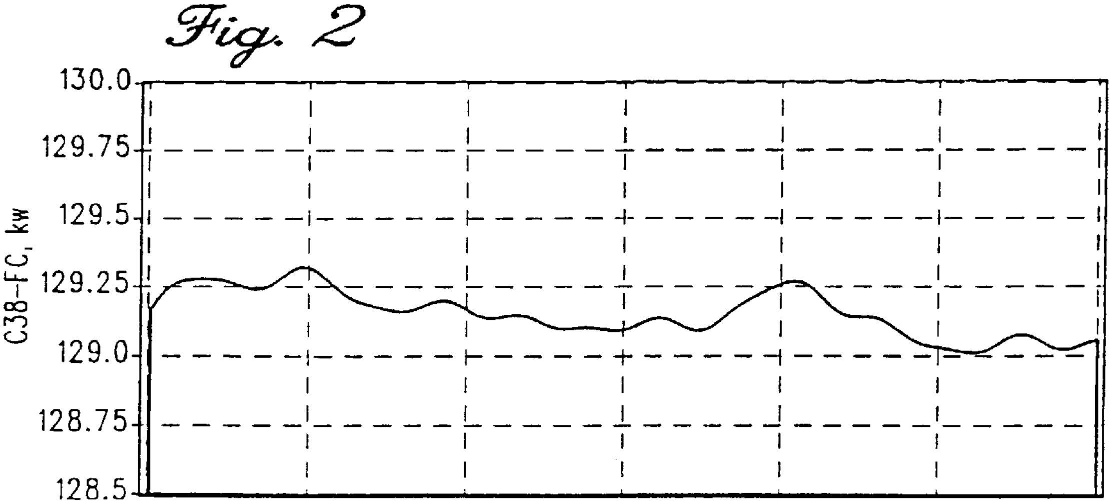
FIG. 2 shows a Fourier composite curve fit to the pump spectral output of FIG. 1.
Figure 3:
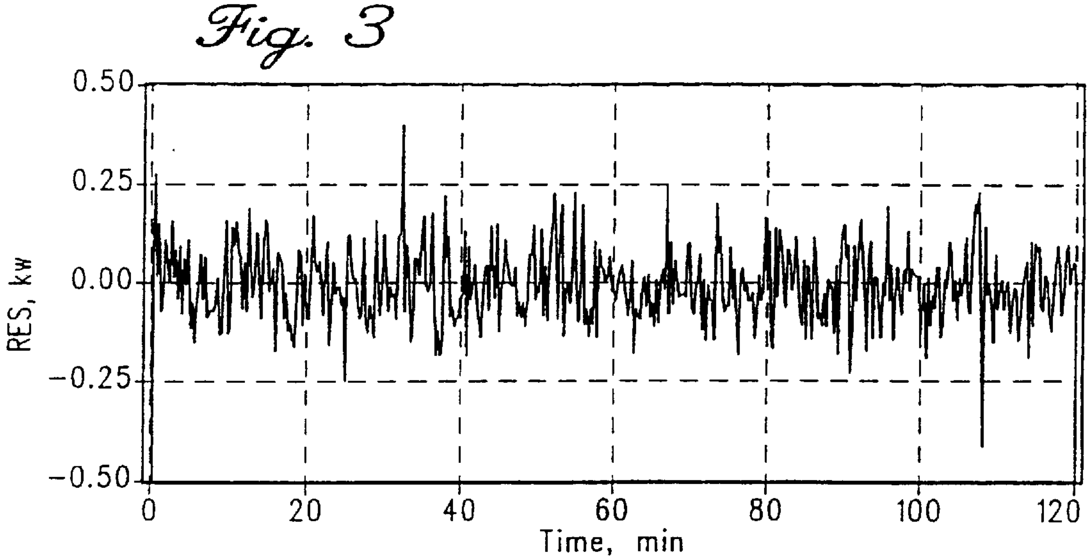
FIG. 3 illustrates a residual function characteristic of the difference between FIGS. 1 and 2.
Figure 4A:
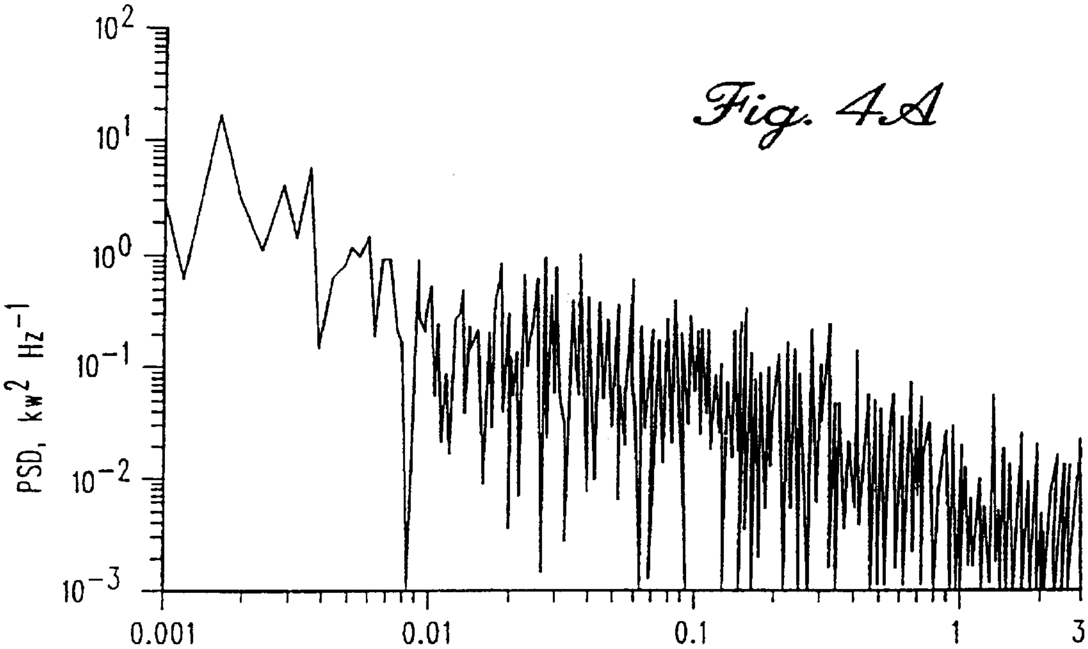
FIG. 4A shows a periodogram of the spectral data of FIG. 1
Figure 4B:
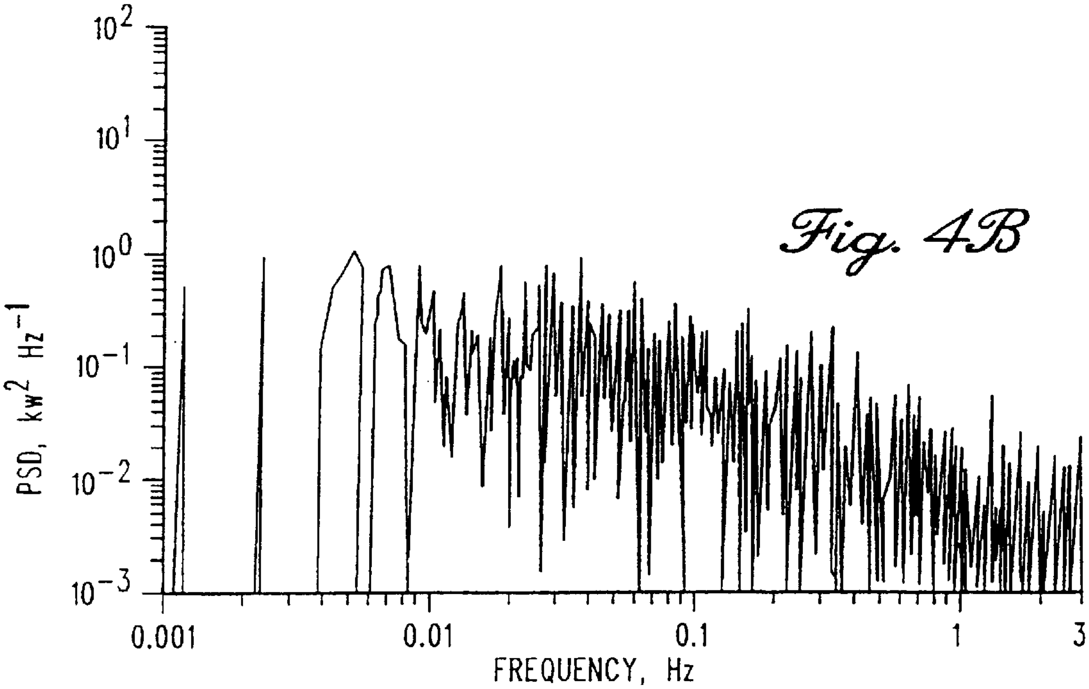
FIG. 4B shows a periodogram of the residual function of FIG. 3.
Figure 5A:
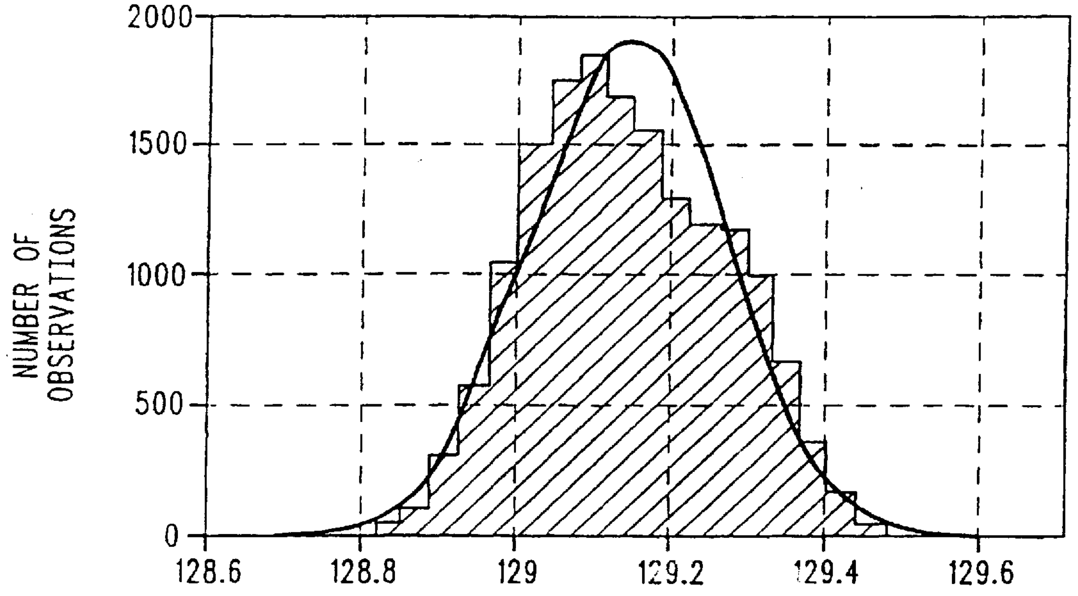
FIG. 5A illustrates a noise histogram for the pump power output of FIG. 1
Figure 5B:
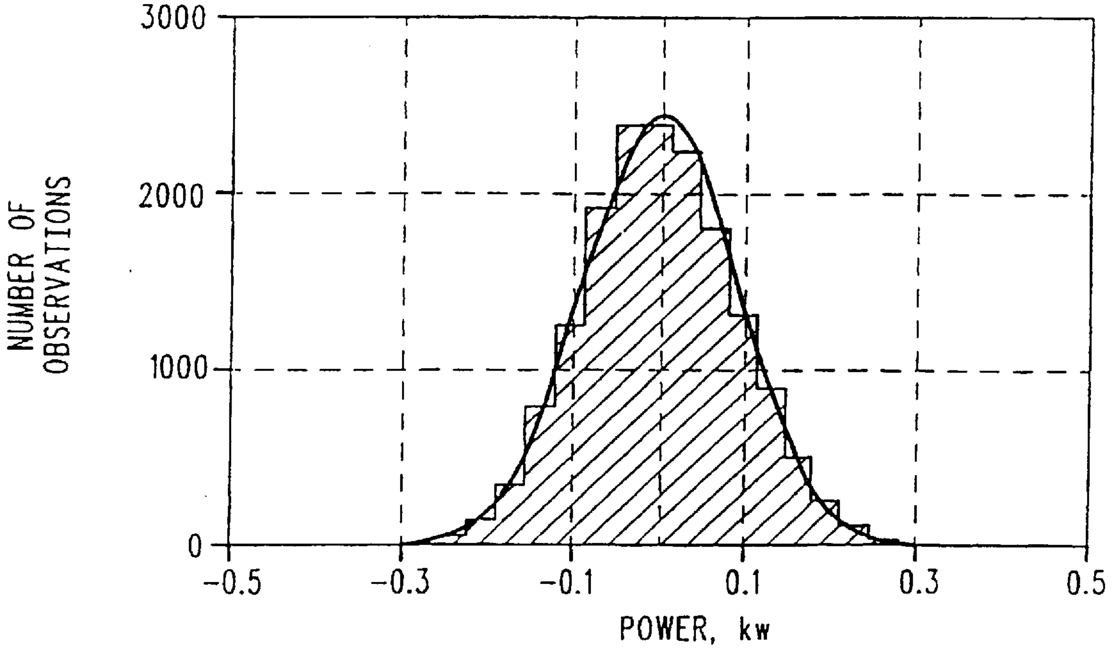
FIG. 5B illustrates a noise histogram for the residual function of FIG. 3.

FIGS. 1–3 illustrate data associated with the preferred spectral filtering approach as applied to the EBR-II primary pump power signal, which measures the power (in kW) needed to operate the pump. The basic procedure of FIG. 8 was then followed in the analysis. FIG. 1 shows 136 minutes of the original signal as it was digitized at the 2-Hz sampling rate. FIG. 2 shows a Fourier composite constructed from the eight most prominent harmonics identified in the original signal. The residual function, obtained by subtracting the Fourier composite curve from the raw data, is shown in FIG. 3. Periodograms of the raw signal and the residual function have been computed and are plotted in FIG. 4. Note the presence of eight depressions in the periodogram of the residual function in FIG. 4B, corresponding to the most prominent periodicities in the original, unfiltered data. Histograms computed from the raw signal and the residual function are plotted in FIG. 5. For each histogram shown we have superimposed a Gaussian curve (solid line) computed from a purely Gaussian distribution having the same mean and variance. Comparison of FIG. 5A and 5B provide a clear demonstration of the effectiveness of the spectral filtering in reducing asymmetry in the histogram. Quantitatively, this decreased asymmetry is reflected in a decrease in the skewness (or third moment of the noise) from 0.15 (raw signal) to 0.10 (residual function).

It should be noted here that selective spectral filtering, which we have designed to reduce the consequences of serial correlation in our sequential testing scheme, does not require that the degree of nonnormality in the data will also be reduced. For many of the signals we have investigated at EBR-II, the reduction in serial correlation is, however, accompanied by a reduction in the absolute value of the skewness for the residual function.

To quantitatively evaluate the improvement in whiteness effected by the spectral filtering method, we employ the conventional Fisher Kappa white noise test. For each time series we compute the Fisher Kappa statistic from the defining equation $$\kappa = \left[ \frac{1}{N} \sum_{k=1}^{N} 1(\omega_k) \right]^{-1} 1(L) \tag{15}$$

where $1(\omega_k)$ is the PSD function (see Eq. 14) at discrete frequencies $\omega_k$, and 1(L) signifies the largest PSD ordinate identified in the stationary time series.

The Kappa statistic is the ratio of the largest PSD ordinate for the signal to the average ordinate for a PSD computed from a signal contaminated with pure white noise. For EBR-II the power signal for the pump used in the present example has a $\kappa$ of 1940 and 68.7 for the raw signal and the residual function, respectively. Thus, we can say that the spectral filtering procedure has reduced the degree of nonwhiteness in the signal by a factor of 28. Strictly speaking, the residual function is still not a pure white noise process. The 95% critical value for Kappa for a time series with $2^{14}$ observations is 12.6. This means that only for computed Kappa statistics lower than 12.6 could we accept the null hypothesis that the signal is contaminated by pure white noise. The fact that our residual function is not purely white is reasonable on a physical basis because the complex interplay of mechanisms that influence the stochastic components of a physical process would not be expected to have a purely white correlation structure. The important point, however, is that the reduction in nonwhiteness effected by the spectral filtering procedure using only the highest eight harmonics in the raw signal has been found to preserve the pre-specified false alarm and missed alarm probabilities in the SPRT sequential testing procedure (see below). Table I summarizes the computed Fisher Kappa statistics for thirteen EBR-II plant signals that are used in the subject surveillance systems. In every case the table shows a substantial improvement in signal whiteness.

The complete SPRT technique integrates the spectral decomposition and filtering process steps described hereinbefore with the known SPRT binary hypothesis procedure. The process can be illustratively demonstrated by application of the SPRT technique to two redundant delayed neutron detectors (designated DND A and DND B) whose signals were archived during long-term normal (i.e., undegraded) operation with a steady DN source in EBR-II. For demonstration purposes a SPRT was designed with a false alarm rate, $\alpha$, of 0.01. Although this value is higher than we would designate for a production surveillance system, it gives a reasonable frequency of false alarms so that asymptotic values of $\alpha$ can be obtained with only tens of thousands of discrete observations. According to the theory of the SPRT technique, it can be easily proved that for pure white noise (such as Gaussian), independently distributed processes, α provides an upper bound to the probability (per observation interval) of obtaining a false alarm—i.e., obtaining a "data disturbance" annunciation when, in fact, the signals under surveillance are undegraded.

FIGS. 6 and 7 illustrate sequences of SPRT results for raw DND signals and for spectrally-whitened DND signals, respectively. In FIGS. 6A and 6B, and 7A and 7B, respectively, are shown the DN signals from detectors DND-A and DND-B. The steady-state values of the signals have been normalized to zero.

TABLE I

Effectiveness of Spectral Filtering for Measured Plant Signals
Fisher Kappa Test Statistic (N = 16,384)

| Plant Variable I.D. | Raw Signal | Residual Function |
|---|---|---|
| Pump 1 Power | 1940 | 68.7 |
| Pump 2 Power | 366 | 52.2 |
| Pump 1 Speed | 181 | 25.6 |
| Pump 2 Speed | 299 | 30.9 |
| Pump 1 Radial Vibr (top) | 123 | 67.7 |
| Pump 2 Radial Vibr (top) | 155 | 65.4 |
| Pump 1 Radial Vibr (bottom) | 1520 | 290.0 |
| Pump 2 Radial Vibr (bottom) | 1694 | 80.1 |
| DN Monitor A | 96 | 39.4 |
| DN Monitor B | 81 | 44.9 |
| DN Detector 1 | 86 | 36.0 |
| DN Detector 2 | 149 | 44.1 |
| DN Detector 3 | 13 | 8.2 |

Figure 6A:
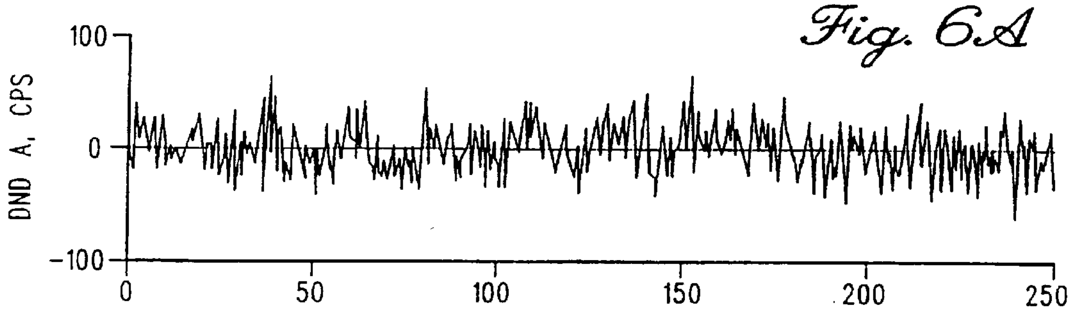
FIG. 6A shows an unmodified delayed neutron detector signal from a first sensor and FIG. 6B is for a second neutron sensor.
Figure 6B:
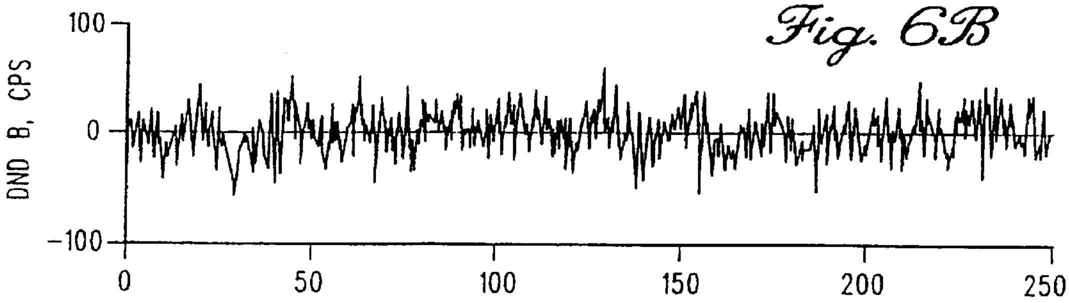
Figure 6C:
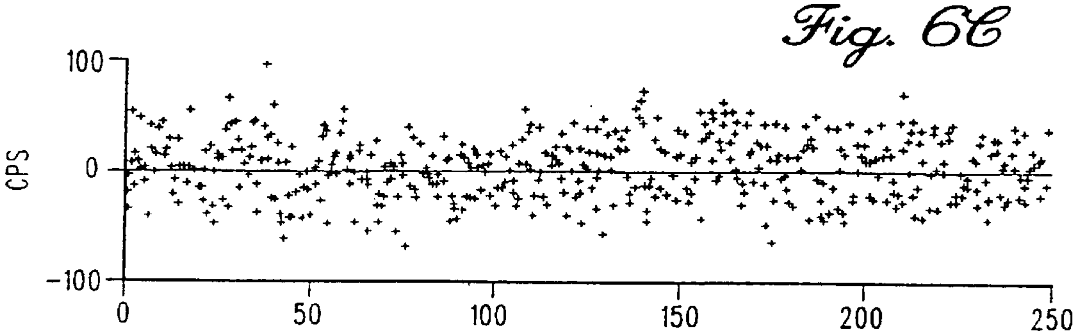
FIG. 6C shows a difference function characteristic of the difference between data in FIG. 6A and 6B and FIG. 6D shows the data output from a SPRT analysis with alarm conditions indicated by the crossed circle symbols.

Normalization to adjust for differences in calibration factor or viewing geometry for redundant sensors does not affect the operability of the SPRT. FIGS. 6C and 7C in each figure show pointwise differences of signals DND-A and DND-B. It is this difference function that is input to the SPRT technique. Output from the SPRT method is shown for a 250-second segment in FIGS. 6D and 7D.

Figure 6D:
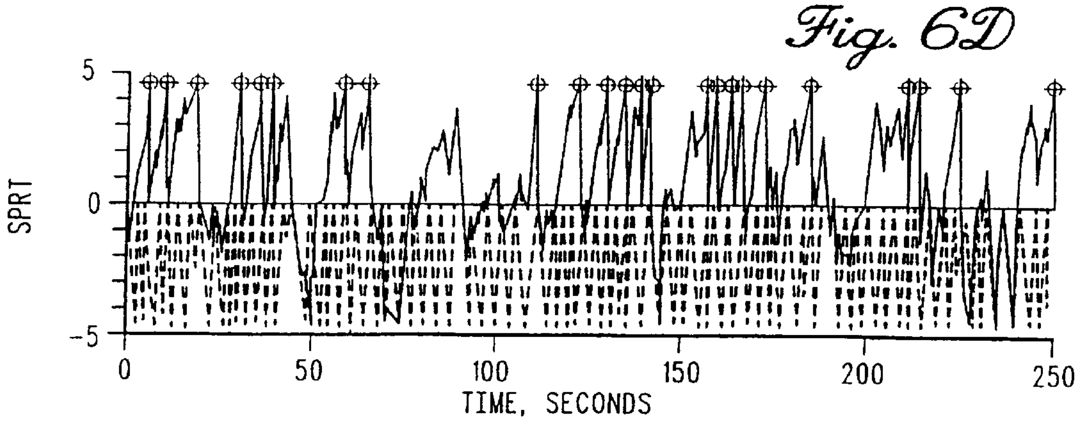
Figure 7A:
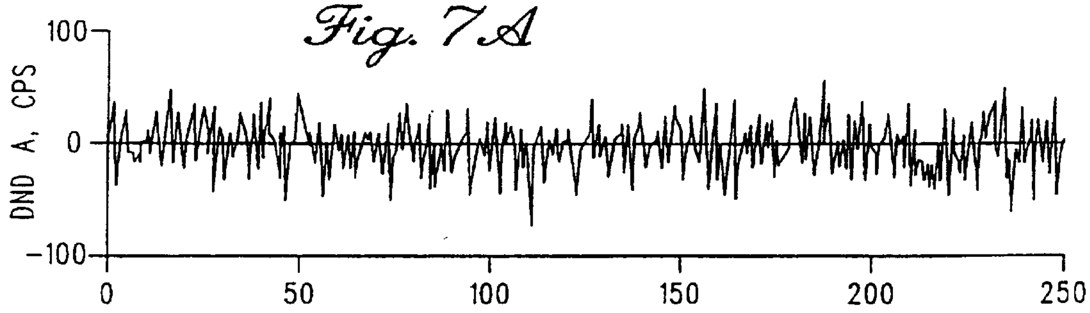
FIG. 7A illustrates an unmodified delayed neutron detector signal from a first sensor and FIG. 7B is for a second neutron sensor.
Figure 7B:
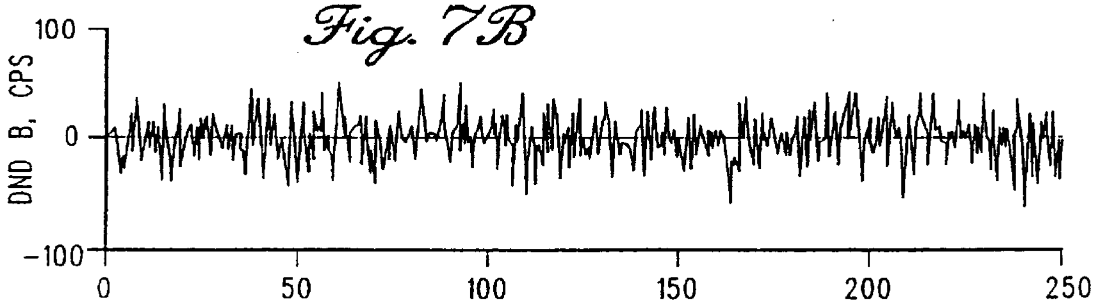
Figure 7C:
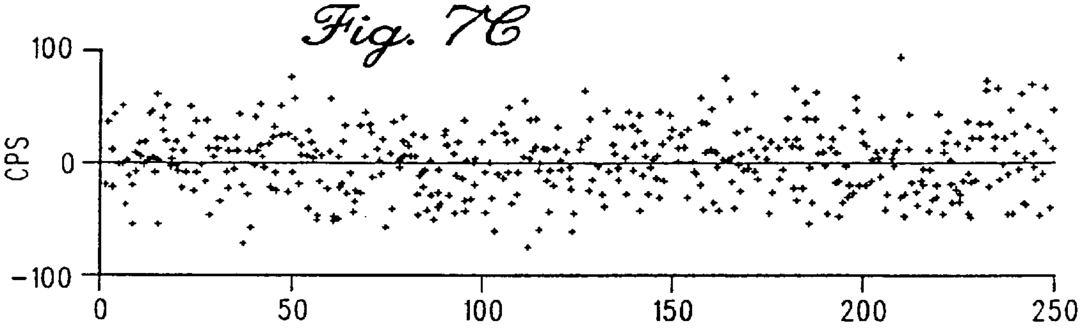
FIG. 7C shows a difference function for the difference between the data of FIG. 7A and 7B and FIG. 7D shows the result of using the instant invention to modify the difference function to provide data free of serially correlated noise to the SPRT analysis to generate alarm information and with alarm conditions indicated by the cross circled signals.
Figure 7D:
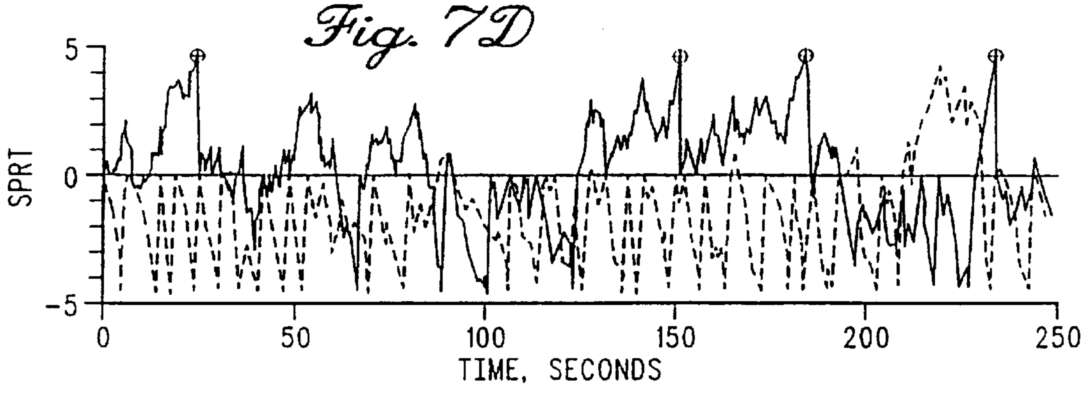

Interpretation of the SPRT output in FIGS. 6D and 7D is as follows: When the SPRT index reaches a lower threshold, A, one can conclude with a 99% confidence factor that there is no degradation in the sensors. For this demonstration A is equal to 4.60, which corresponds to false-alarm and missed-alarm probabilities of 0.01. As FIGS. 6D and 7D illustrate, each time the SPRT output data reaches A, it is reset to zero and the surveillance continues.

If the SPRT index drifts in the positive direction and exceeds a positive threshold, B, of +4.60, then it can be concluded with a 99% confidence factor that there is degradation in at least one of the sensors. Any triggers of the positive threshold are signified with diamond symbols in FIGS. 6D and 7D. In this case, since we can certify that the detectors were functioning properly during the time period our signals were being archived, any triggers of the positive threshold are false alarms.

If we extend sufficiently the surveillance experiment illustrated in FIG. 6D, we can get an asymptotic estimate of the false alarm probability α. We have performed this exercise using 1000-observation windows, tracking the frequency of false alarm trips in each window, then repeating the procedure for a total of sixteen independent windows to get an estimate of the variance on this procedure for evaluating α. The resulting false-alarm frequency for the raw, unfiltered, signals is α=0.07330 with a variance of 0.000075. The very small variance shows that there would be only a negligible improvement in our estimate by extending the experiment to longer data streams. This value of α is significantly higher than the design value of α=0.01, and illustrates the danger of blindly applying a SPRT test technique to signals that may be contaminated by excessive serial correlation.

The data output shown in FIG. 7D employs the complete SPRT technique shown schematically in FIG. 8. When we repeat the foregoing exercise using 16 independent 1000-observation windows, we obtain an asymptotic cumulative false-alarm frequency of 0.009142 with a variance of 0.000036. This is less than (i.e., more conservative than) the design value of α=0.01, as desired.

It will be recalled from the description hereinbefore regarding one preferred embodiment, we have used the eight most prominent harmonics in the spectral filtration stage of the SPRT technique. By repeating the foregoing empirical procedure for evaluating the asymptotic values of α, we have found that eight modes are sufficient for the input variables shown in Table I. Furthermore, by simulating subtle degradation in individual signals, we have found that the presence of serial correlation in raw signals gives rise to excessive missed-alarm probabilities as well. In this case spectral whitening is equally effective in ensuring that pre-specified missed-alarm probabilities are not exceeded using the SPRT technique.

In another different form of the invention, it is not necessary to have two sensor signals to form a difference function. One sensor can provide a real signal characteristic of an ongoing process and a record artificial signal can be generated to allow formation of a difference function. Techniques such as an auto regressive moving average (ARMA) methodology can be used to provide the appropriate signal, such as a DC level signal, a cyclic signal or other predictable signal. Such an ARMA method is a well-known procedure for generating artificial signal values, and this method can even be used to learn the particular cyclic nature of a process being monitored enabling construction of the artificial signal.

The two signals, one a real sensor signal and the other an artificial signal, can thus be used in the same manner as described hereinbefore for two real sensor signals. The difference function Y is then formed, transformations performed and a residual function is determined which is free of serially correlated noise.

Fourier techniques are very effective in achieving a whitened signal for analysis, but there are other means to achieve substantially the same results using a different analytical methodology. For example, filtration of serial correlation can be accomplished by using the autoregressive moving average (ARMA) method. This ARMA technique estimates the specific correlation structure existing between sensor points of an industrial process and utilizes this correlation estimate to effectively filter the data sample being evaluated.

A technique has therefore been devised which integrates frequency-domain filtering with sequential testing methodology to provide a solution to a problem that is endemic to industrial signal surveillance. In one form of the subject invention, this allows sensing slow degradation that evolves over a long time period (gradual decalibration bias in a sensor, appearance of a new radiation source (or other individual source) in the presence of a noisy background signal, wear out or buildup of a radial rub in rotating machinery, etc.). The system thus can alert the operator of the incipience or onset of the disturbance long before it would be apparent to visual inspection of strip chart or CRT signal traces, and well before conventional threshold limit checks would be tripped. This permits the operator to terminate, modify or avoid events that might otherwise challenge technical specification guidelines or availability goals. Thus, in many cases the operator can schedule corrective actions (sensor replacement or recalibration; component adjustment, alignment, or rebalancing; etc.) to be performed during a scheduled system outage.

Another important feature of one form of the invention which distinguishes it from conventional methods is the built-in quantitative false-alarm and missed-alarm probabilities. This is quite important in the context of high-risk industrial processes and applications. The invention makes it possible to apply formal reliability analysis methods to an overall system comprising a network of interacting SPRT modules that are simultaneously monitoring a variety of plan variables. This amenability to formal reliability analysis methodology will, for example, greatly enhance the process of granting approval for nuclear-plant applications of the invention, a system that can potentially save a utility millions of dollars per year per reactor.

In another aspect of the invention the signals received from a sensor monitoring an industrial (or biological) process 100 (hereinafter, "industrial process") can be optimized for comparison to a reference signal characteristic of a desired operating state. In a method generally indicated in FIG. 9A, the industrial process (represented by the initial box) is monitored by one or more sensors which generate a plurality of data sets over a data collection period. A conventional data acquisition system 102 includes a single signal extractor for providing an input signal in the correct digital form for monitoring, for example, with the SPRT technique described hereinbefore. These data signals are similar in shape but can vary in length and/or phase due to system variables (signal source and/or sensor and/or external variables). The sensed signals can be adjusted in length and/or phase in order to prepare a representative data set of the sensed signals for comparison to a reference set representative of a normal (desired) process.

Figure 9A:
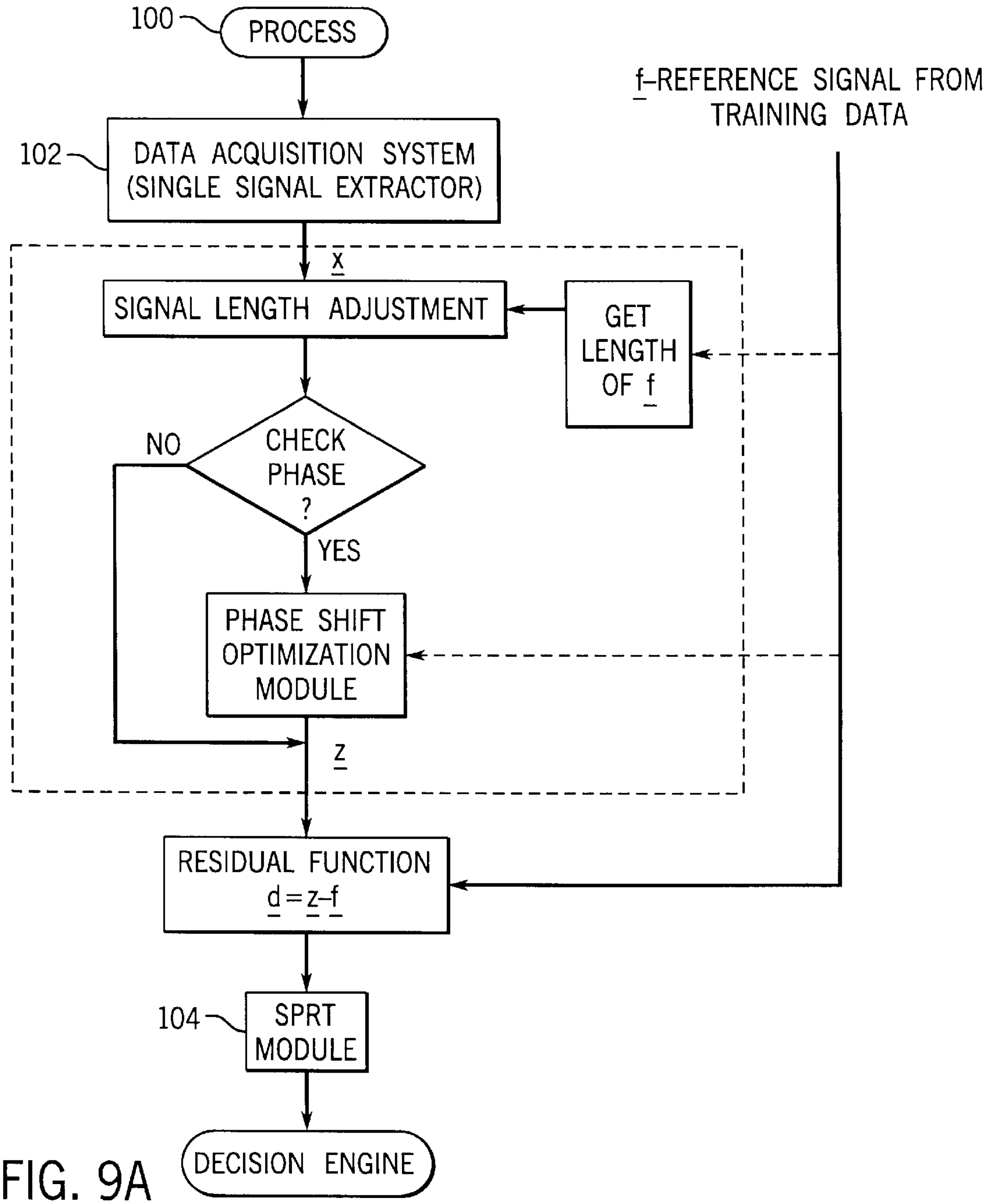
FIG. 9A illustrates a functional block flow diagram describing signal length equalization, phase adjustment relative to a standard reference signal and processing by a SPRT technique.
Figure 9B:
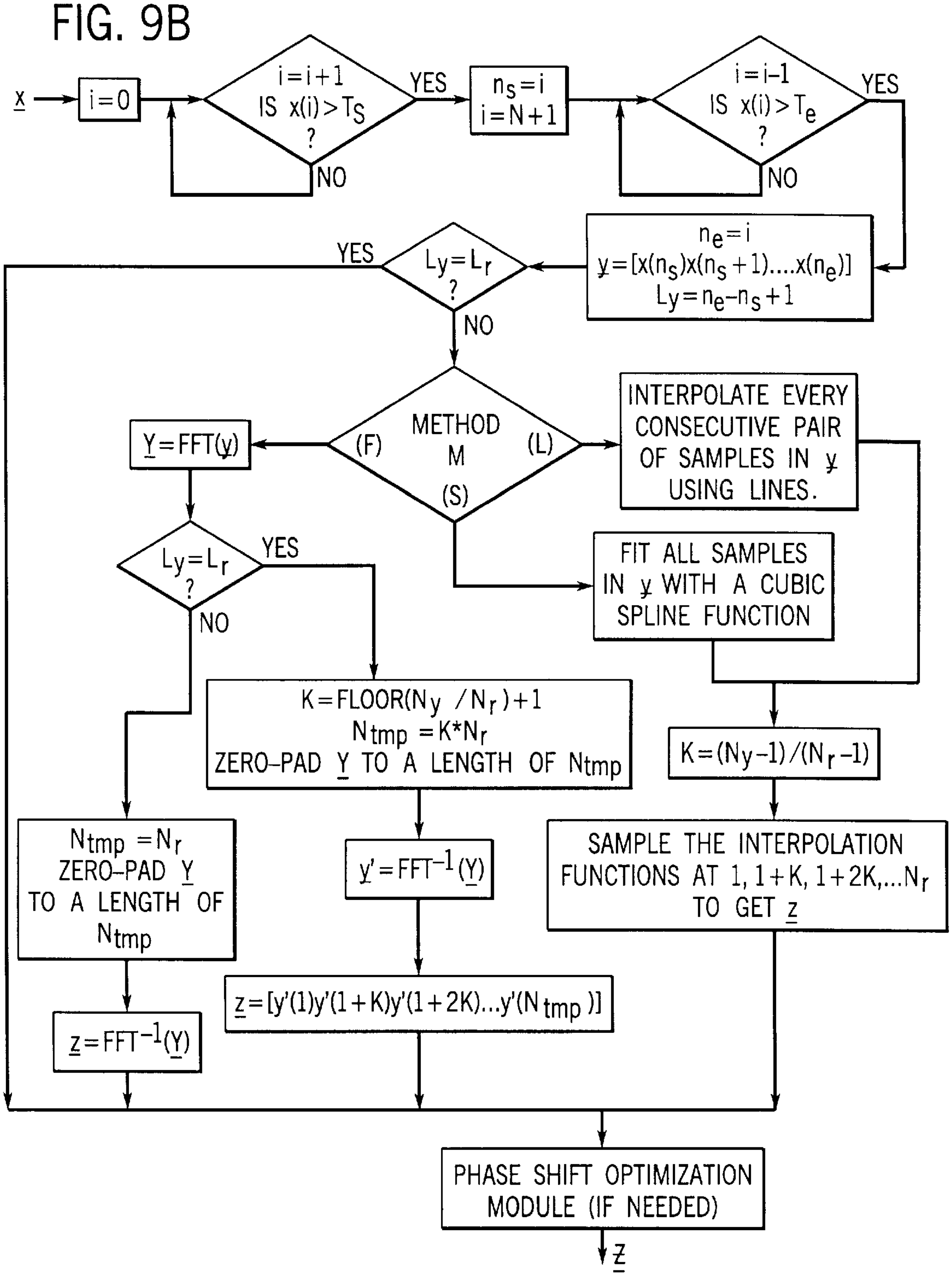
FIG. 9B illustrates the details of signal length equalization and FIG. 9C illustrates the details of signal phase adjustment.

Therefore, in one aspect of the invention shown in FIG. 9A, the industrial process signals can be adjusted in length by being compressed or dilated to optimize the match with the reference signal waveform, or reference data set. This reference signal data-set defines a reference signal length to which all of the input signals are to be equalized. In another form of the invention, the signals can be adjusted in length by selecting one of the plural data sets as a "reference" data set and adjusting all other sensed data relative to that reference set. This compression/dilation adjustment ("equalization" herein) can in some circumstances even involve both compression and dilation if system variables cause segmentation (length reduction in one time period and expansion in another) of industrial process signals over a selected data-taking period.

In addition to the equalization or length adjustment step, the phases of the industrial process signals can be adjusted before, after, or even in parallel (at substantially the same time), as the data compression and/or dilation is being carried out. This phase adjustment step is shown generally in FIG. 9A and in more detail in FIG. 9C. Examples of phase adjustment or "equalization" are described in further detail in Example IX and X. As noted in FIG. 9C, a reference signal f and data signal z are input to a cross correlation analysis functionality. This step involves performing an iterative regression procedure that generates a vector of correlation coefficients C with respect to lag time $\tau$ for each input and reference signal pair. The correlation coefficients C are input to a low-pass filter. Since noise exists in the input signal, there is noise in the cross correlation-vector A, both for the data input and reference signals, z and f, respectively. By passing C through a low-pass filter, most noise will be eliminated. The resulting filtered data is then processed by calculating the phase shift between the input data signal z and the reference signal f. Several example methods are shown as the last step in FIG. 9C. In one method, vector C is differentiated with respect to $\tau$, and the results are stored as vector C'. An inverse Lagrangian interpolation technique can be used to numerically compute the root of C'. The value of $\tau$ at which this derivative vanishes defines the true phase shift between the input and reference signals. In a second example method, if the phase difference needs to be determined only in terms of sample numbers, the maximum can be found among the elements of vector C. The value of $\tau$ at which this maximum occurs defines the sample phase shift between the input and reference signals. Therefore, the input is shifted by the number of samples found to make the two signals be in phase. The first example method described hereinbefore generally provides more accuracy, if desired.

A variety of analytic methods can be used to implement the various embodiments of monitoring apparati and methods of monitoring industrial processes. The nonlimiting examples provided hereinafter illustrate several such analytical methods.

After the above-described length equalization and/or phase adjustments are completed, the corrected signal is subtracted from the reference signal to produce a residual function. This residual function can be fed into the SPRT module 104 and the SPRT processed date is then presented to a decision engine, such as a human or an automated computerized system formatted to generate an alarm in accordance with a predetermined set of conditions.

EXAMPLE I

Figure 10A:
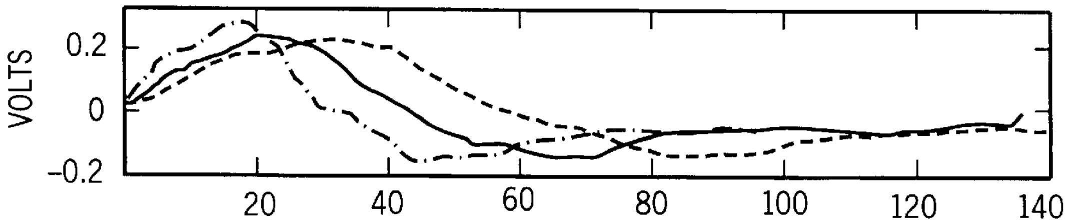
FIG. 10A illustrates a plurality of separate patient cardiac test signals taken over an interval of time with the different traces having different lengths over time.
Figure 10B:
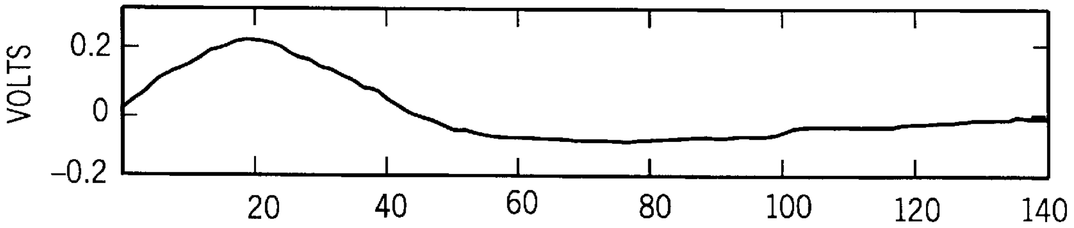
FIG. 10B illustrates the average of the traces in FIG. 10A.
Figure 10C:
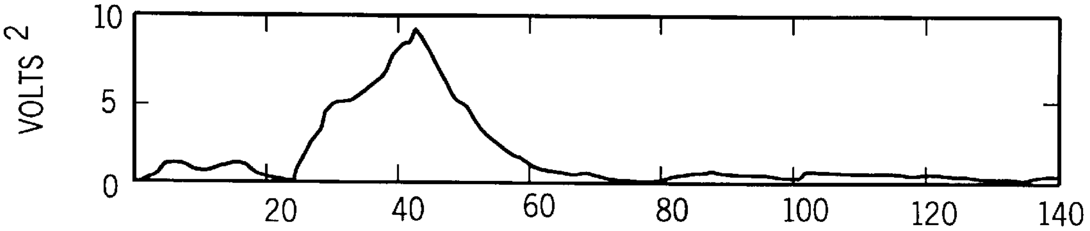
FIG. 10C illustrates the average variance from the average trace of the different traces of FIG. 10A.
Figure 10D:
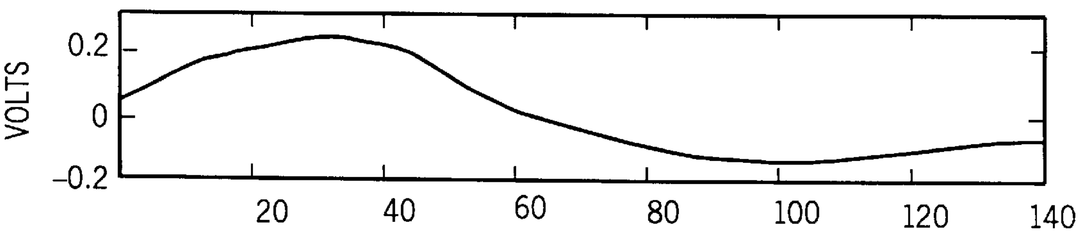
FIG. 10D shows a reference data set of cardiac signals.

In one method of the invention, cardiac signals are accumulated to provide a reference data set illustrative of a normal cardiac system and then a data set from a patient is collected for comparison with the reference. The cardiac signals shown in FIG. 10A were extracted from a sequence of approximately 100 similar signals recorded serially from an electrocardiogram. These illustrated signals are snapshots of individual heart beats taken from the recorded data. This reference signal is an average of twenty normal length heart signals taken from an electrocardiogram in the same manner as the input test signals. The reference data is collected by conventional electrocardiogram techniques. The plurality of cardiac signals of FIG. 10A represent one beat of the heart, and each signal is of different length than the other. Without correction for length difference relative to a reference signal, there would be errors in the comparison. The average of the three signals is shown in FIG. 10B. In FIG. 10C is shown the average variance of the three signals from the reference signal. FIG. 10D shows a reference data set of cardiac signals used in the procedure. The value of each signal at a specific time point, $\tau$, for the three sets of data are used to calculate the variance at $\tau$, employing, $$\sigma^2 = \frac{1}{N-1} \sum_{(i)=1}^{N=3} (y_i(t_i) - \mu)^2$$

where $\mu$=average of the three samples. This procedure is repeated for the full time spectrum $t_i$=1 to N.

Referring to FIG. 10C, the largest peak in the variance arises from a large discrepancy between the signals. If these signals were compared directly (without adjustment) to a reference signal, the result would be a false error (residual) signal which would in turn affect the output of an analytical procedure, such as a SPRT methodology, and potentially lead to misidentification of a fault condition.

Example II

The equalization of the patient test data to the reference data from Example I is accomplished by a linear compression/dilation method based on fitting a piecewise linear function $f(x)$ though all the points of the cardiac patient test signals. The first step is to determine whether the signal needs to be compressed or dilated by comparing its length to the cardiac reference signal length. If the reference signal is longer than the test signal, then the test signal is dilated; if the reference signal is shorter than the test signal then the test signal is compressed; and if both signals have the same length then nothing is done to the length of the test signal. Having the reference length N, and the test signal length N, the interval between the consecutive points where the piecewise function is evaluated to create the equalized signal can be determined relative to the initial points in the reference signal. The interval size is given as:

$$\Delta = \frac{(N_t - 1)}{(N_r - 1)} \tag{16}$$

Therefore, the new set of sample time points is given by the following.

$$x_{ij} = x_{j-1} + \Delta, \quad j = 1, 2, 3, \ldots N_r. \tag{17}$$

where, $$x_1 = x_{01}$$

$$x_{N_r} = x_{0N_1} \tag{18}$$

For each pair of the initial time points $(x_{0p}x_{0i+1})$ a line is drawn from $p(x_{0i})$ to $p(x_{0i+})$. Here p(x) is the value of the data sample at time point $_x$ from the original test signal. Next, any new time points that lie within $(x_{0p}x_{0i+1})$ are evaluated using:

$$f(x) = p(x_{0i}) + \frac{x - x_{0i}}{x_{0i+1} - x_{0i}} (p(x_{0i+1}) - p(x_{0i})). \tag{19}$$

This procedure continues until all the new time points found in (1.2) are evaluated within the appropriate intervals defined by $[x_{0p}x_{0i}]$ for i=1,2,3, . . . $N_1$, giving the desired dilated or compressed signal with a final length equal to the length of the reference signal.

Figure 11A:
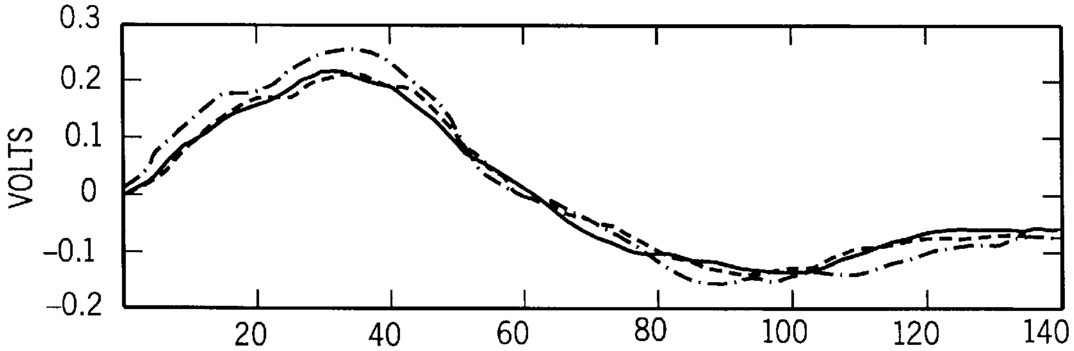
FIG. 11A illustrates the plurality of cardiac signals of FIG. 10A after linear equalization of signal length.
Figure 11B:
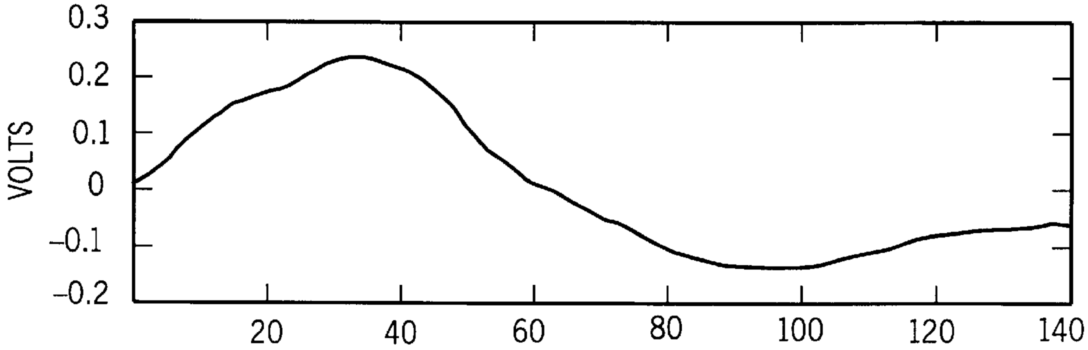
FIG. 11B is an average of the traces in FIG. 11A.
Figure 11C:
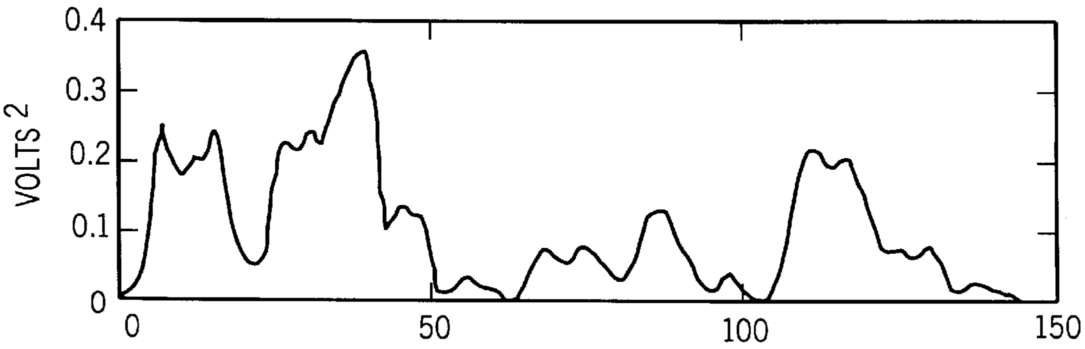
FIG. 11C shows the average variance from the average trace of the different traces of FIG. 11A.
Figure 18A:
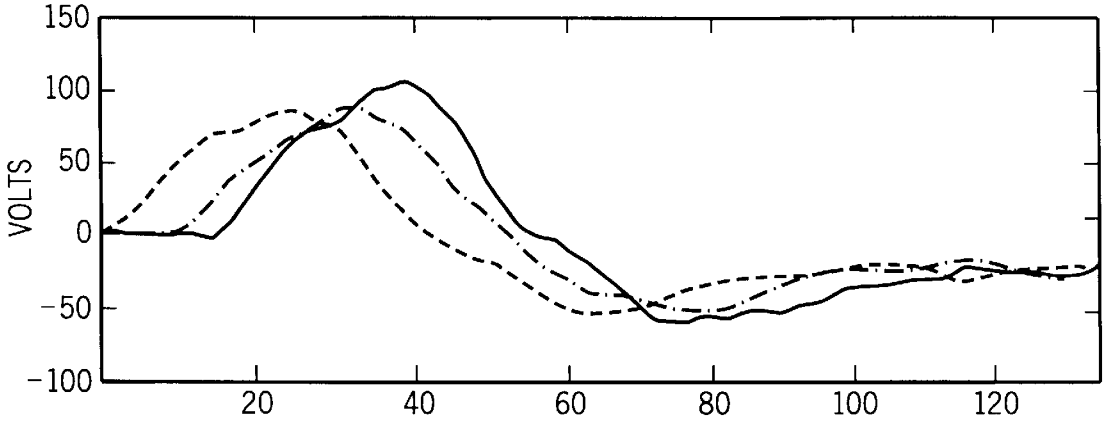
FIG. 18A illustrates cardiac reference and patient test data before phase optimization and FIG. 18B is after applying a phase shift optimization.
Figure 18B:
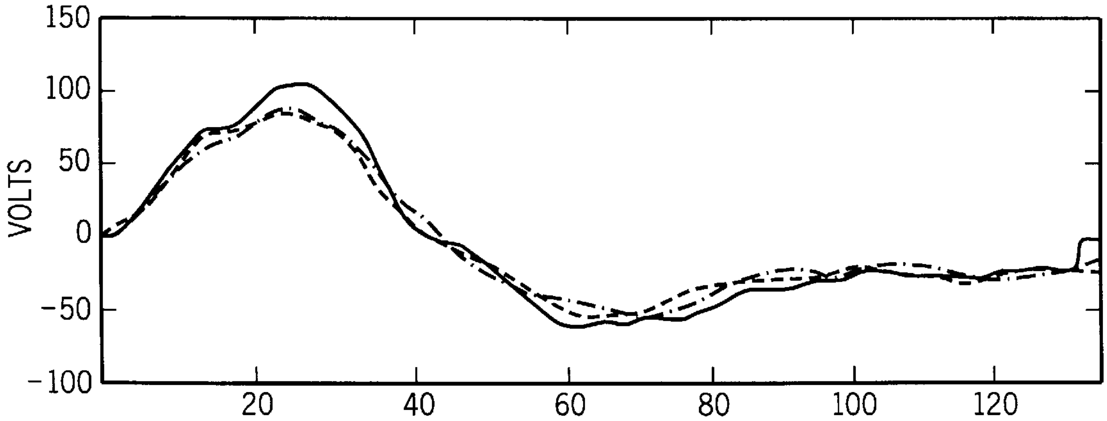

A computer software Appendix B is attached hereto and describes one method of implementation of the linear compression/dilation method. FIG. 11A shows the results of equalization on the plurality of patient cardiac signals. In the case of the cardiac signals, the lengths are equalized in length and thus are consequently in phase. If they were not in phase, it would be desirable to carry out the phase equalization step illustrated in FIG. 9C. An example of this is shown in FIGS. 18A and 18B. Regarding the cardiac signals of FIG. 11A, FIG. 11B is the average signal of the signals in FIG. 11A; and FIG. 11C is the average variance of the three cardiac signals relative to the reference signal. The improvement of the variance is shown in FIG. 11C versus FIG. 10C.

EXAMPLE III

The equalization of the patient test data to the reference data from Example I can also be accomplished by a spline method which is similar to the linear method. The spline method is similar to the linear method in that a function is fitted through all the data points of the initial cardiac test signal. The spline method has the advantage of being continuous in the zero, first and second order derivatives on the interval $[x_{00}, x_{0N1}]$. The new time points to be evaluated using the spline method are found in the same way as in the linear method using (16) and (17). To evaluate the new time points a cubic spline that interpolates the battery test signal at $x_{0i}$, i=1,2, . . . $N_1$ is used and is given by, $$s(x) = p(x_{oi}) + \dot{s}_i(x_{oi})\,(x - x_{oi}) + \frac{z_i}{2}(x - x_{0i})^2 + \frac{z_{i+1} - z_i}{6h_i}(x - x_{0i})^3 \tag{20}$$

where here $(\cdot)$ denotes the first derivative, $h_i = x_{0i+1} - {}_{0i}$ and i=1,2, . . . $N_t$–1. The values for $z_i$, i=1,2, . . . , $N_t$, are found by satisfying the system of equations $$h_i z_i + 2(h_i + h_{i+1})z_{i+1} + h_{i+1}h_{i+2} = 6\left(\frac{p(x_{0i+2}) - p(x_{0i+1})}{h_{i+1}} - \frac{p(x_{0i+1}) - p(x_{0i})}{h_i}\right) \tag{21}$$

where i=1,2, . . . , $N_{t-2}$ and $z_1 = Z_{Nt} = 0$. To evaluate the derivative of $s_i(x_{oi})$ the following equation is used, $$\dot{s}_i(x_{0i}) = \frac{p(x_{0i+1}) - p(x_{0i})}{h_i} - z_{i+1}\frac{h_i}{6} - z_i\frac{h_i}{3},\ i = 1,2,\ldots,N_t - 1. \tag{22}$$

The new time points $x_i$, i=1,2, . . . , $N_r$, are evaluated using equation (19) within the appropriate intervals defined by $[x\text{-}x_{0i+1}]$ as was done in the linear method.

Figure 12A:
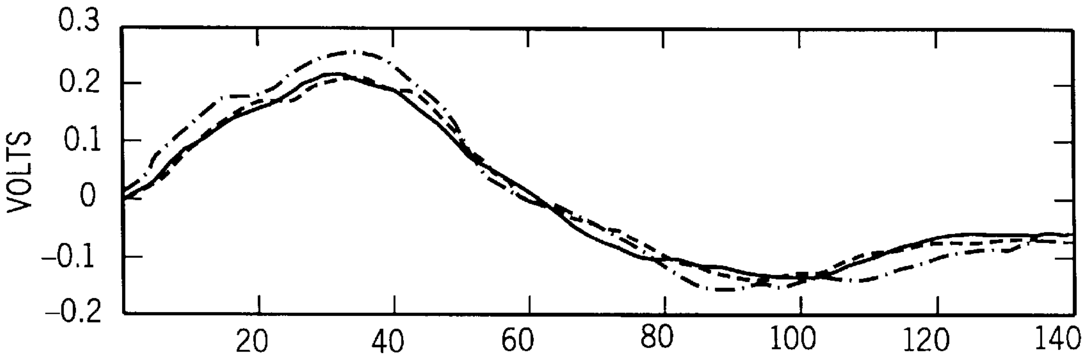
FIG. 12A illustrates the plurality of cardiac signals of FIG. 10A after spline interpolation equalization of signal length.
Figure 12B:
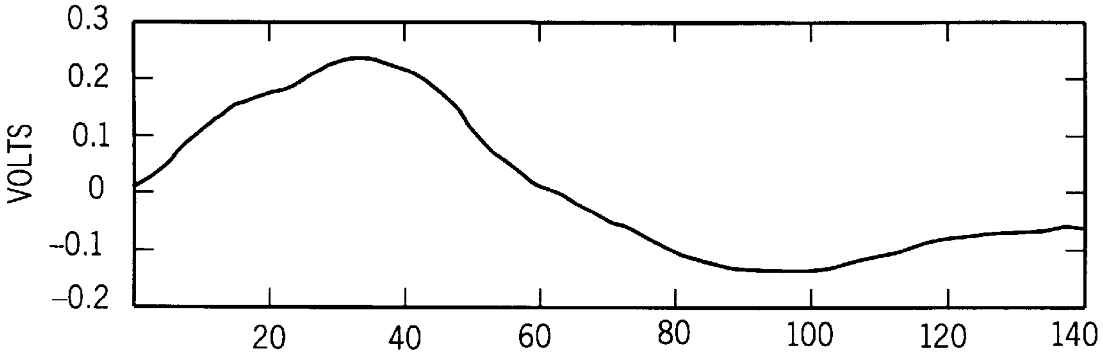
FIG. 12B is an average of the traces in FIG. 12A.
Figure 12C:
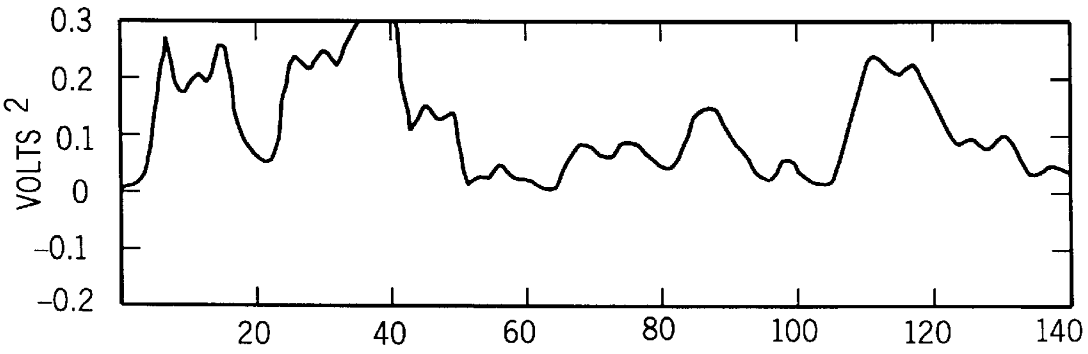
FIG. 12C shows the average variance from the average trace of the different traces of FIG. 12A.

A computer software Appendix C is attached hereto which describes the implementation of the spline compression/dilation method. FIG. 12A shows the results of equalization on the plurality of patient cardiac signals, FIG. 12B is the average signal of the signals in FIG. 12A; and FIG. 12C is the average variance of the three cardiac signals relative to the reference signal. The improvement of the variance is shown in FIG. 12C versus FIG. 10C.

EXAMPLE IV

The equalization of the patient test data to the reference data from Example I can also be accomplished by a fast Fourier transform ("FFT") method. The FFT method is different that the linear and spline methods in that the initial test signal $p(x_{0i})$, i=1,2, . . . , $N_t$, is transformed into the frequency domain and resampled to accomplish the length equalization instead of trying to fit the samples in the test signal with an interpolation function in the time domain. The first step in the FFT method is to calculate the FFT of the input signal p(x). The FFT is calculated using the formula:

$$P(k) = \sum_{x=0}^{N_t-1} p(x)e^{-j\left(\frac{2\pi kx}{N_t}\right)} \tag{23}$$

The FFT, P(k), has the same length as the input signal, p(x). The next step is to determine whether the test signal needs to be dilated or compressed. If the signal is to be compressed, i.e.$(N_t > N_r)$ then a temporary length longer than $N_t$ is computed using the following formula:

$$N_{tmp} = \left[\text{floor}\left(\frac{N_t}{N_r}\right) + 1\right] * N_t. \tag{24}$$

If the test signal is to be dilated i.e. $(N_t < N_r)$ then $(N_{tmp} = N_r)$. The reason for finding the value for $N_{tmp}$ is that a new longer signal in the time domain can be found by zero-padding the FFT, P(k) and then talking the inverse FFT of the results. So, if we let $P_n(k)=P(k)$ (after zero-padding to length $N_{tmp}$) a new time domain version of p(x) is created using the inverse FFT formula, $$p_n(x) = \frac{1}{N_{tmp}} \sum_{k=0}^{N_{tmp}-1} P_n(k) e^{j\left(\frac{2\pi kx}{N_{tmp}}\right)}. \tag{25}$$

For the case when p(x) needs to be dilated $p_n(x)$ is the final length equalized signal solution. For the case when p(x) needs to be compressed there is one more step. Using the first part of equation (23) a sampling interval is calculated:

$$T = \text{floor}\left(\frac{N_t}{N_r}\right) + 1. \tag{26}$$

Then the dilated signal $p_n(x)$ is sampled at the following intervals: x=1, 1+T, 1+2T, 1+3T, . . . , $N_{tmp}$, which results in a final signal with the desired length, $N_r$.

Figure 13A:
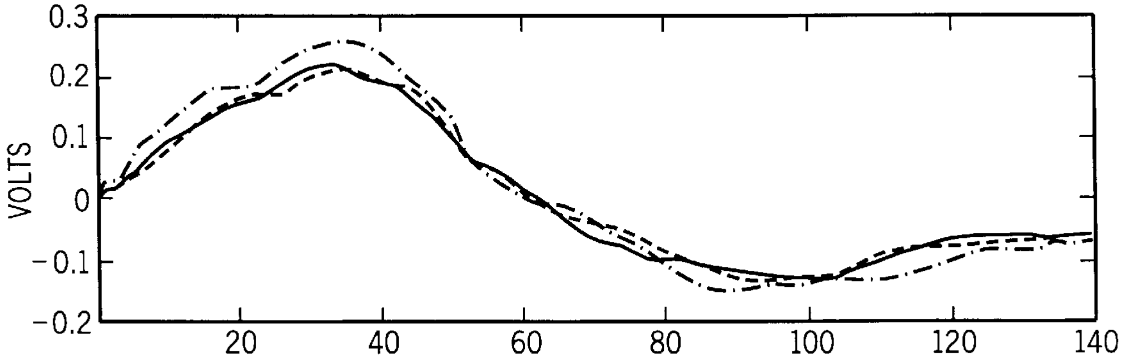
FIG. 13A illustrates the plurality of cardiac signals of FIG. 10A after FFT equalization of signal length.
Figure 13B:
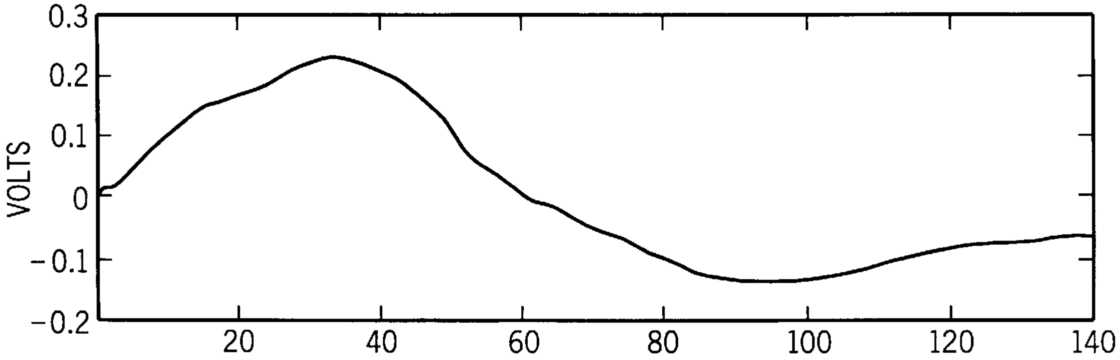
FIG. 13B is an average of the traces in FIG. 13A.
Figure 13C:
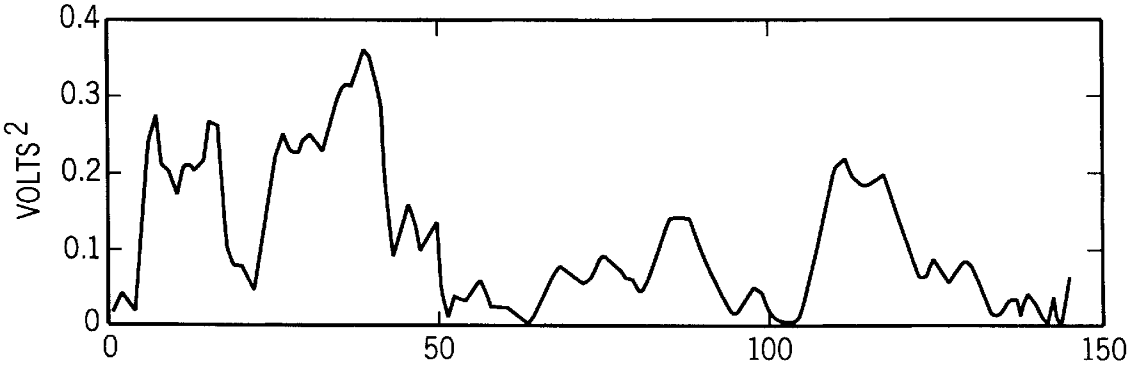
FIG. 13C shows the average variance from the average trace of the different traces of FIG. 13A.

A computer software Appendix D is attached hereto which describes the implementation of the FFT compression/dilation method. FIG. 13A shows the results of equalization on the plurality of patient cardiac signals, FIG. 13B is the average signal of the signals in FIG. 13A; and FIG. 13C is the average variance of the three cardiac signals relative to the reference signal. The improvement of the variance is shown in FIG. 13C versus 10C. The difference in results when using the different interpolation techniques in the compression/dilation method is largely dependant on the characteristics of the input signal. In cases where the signal is relatively smooth and slowly changing (such as with the cardiac signals) the three methods perform equally well. Therefore, the choice for the interpolation should be the linear method since it is least computationally expensive. For the case when the input signals are noisy or have large high frequency components (as in the battery signals described hereinbefore in Examples VI–VIII), the spline or FFT methods are better since they can more closely fit the behavior of the signal. When choosing between the FFT and spline methods, the hardware of the system is the main deciding factor. If the system has special DSP (Digital Signal Processing) hardware, it is possible for the FFT method to be less of a computational burden then the spline method even though the FFT method requires more operations than the spline method.

EXAMPLE V

Figure 14A:
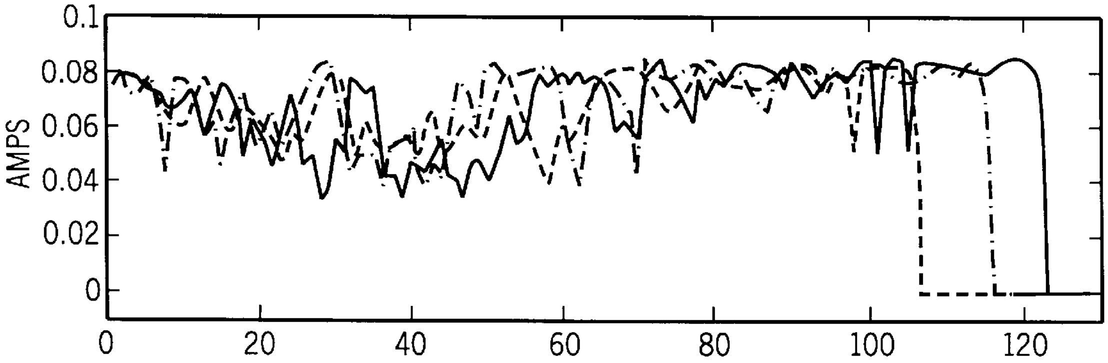
FIG. 14A illustrates a plurality of battery testing signals.
Figure 14B:
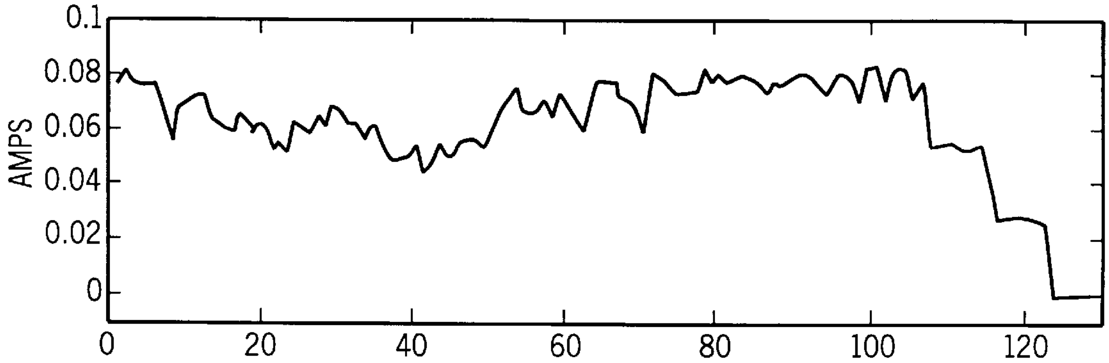
FIG. 14B is an average of the traces in FIG. 14A.
Figure 14C:
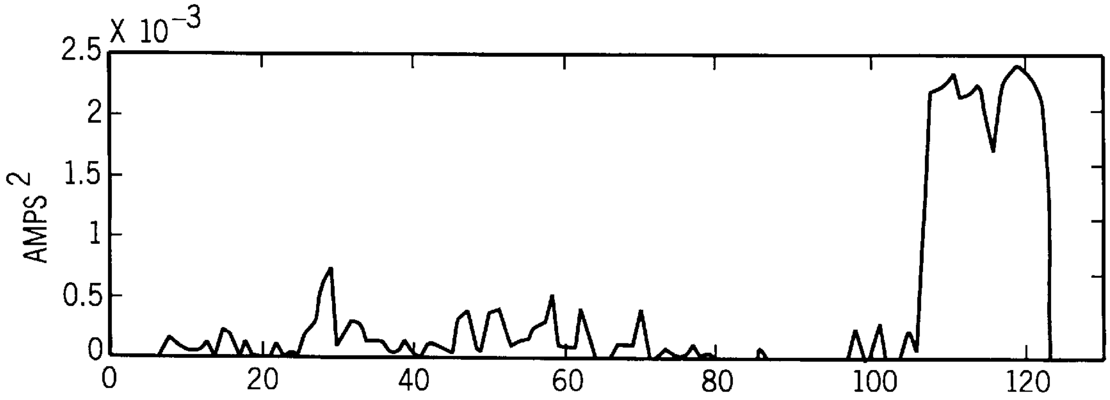
FIG. 14C shows the average variance from the average trace of the different traces of FIG. 14A.

In another illustration of the invention, battery quality is tested before shipping from a factory. This procedure commences with preparing a reference data set by accumulating data from batteries known to be good. These "good" battery traces are equalized in length and then summed over each time point to create an average reference data set. After creating the average battery trace a variance signal is created using the same signals. Data sets from the batteries to be tested were accumulated from 200 batteries in order to determine whether the batteries meet performance requirements. The test data were collected by connecting data acquisition system to a battery testing apparatus. A voltage was applied across the terminals of the battery and the resulting current was measured. The data acquisition system converted the analog signal to digital format, and the results were stored on a disk. FIG. 14A illustrates a plurality of battery test signals with different time length. These differences can be caused, for example, by change in line speed of the battery tester, movement within a battery testing slot and bouncing of the battery test fingers. FIG. 14B shows the average of the plurality of test signals in FIG. 14A, and FIG. 14C is the average variance of the three battery test signals relative to the reference signal.

EXAMPLE VI

Figure 15A:
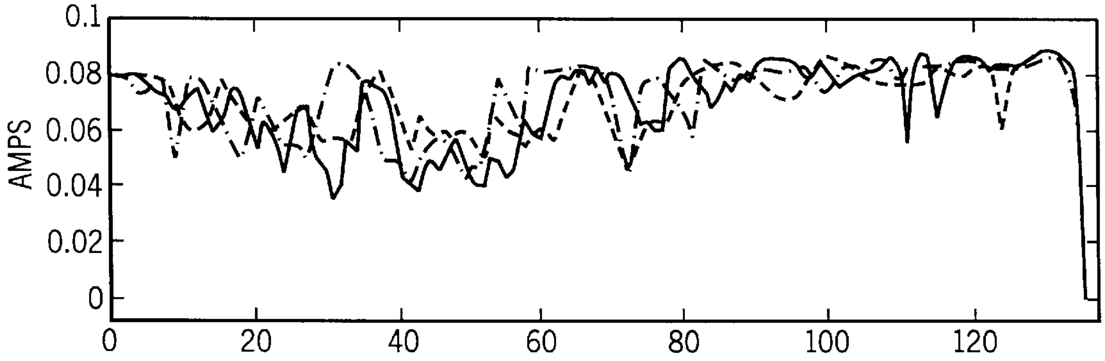
FIG. 15A illustrates the plurality of cardiac signals of FIG. 10A after linear equalization of signal length.
Figure 15B:
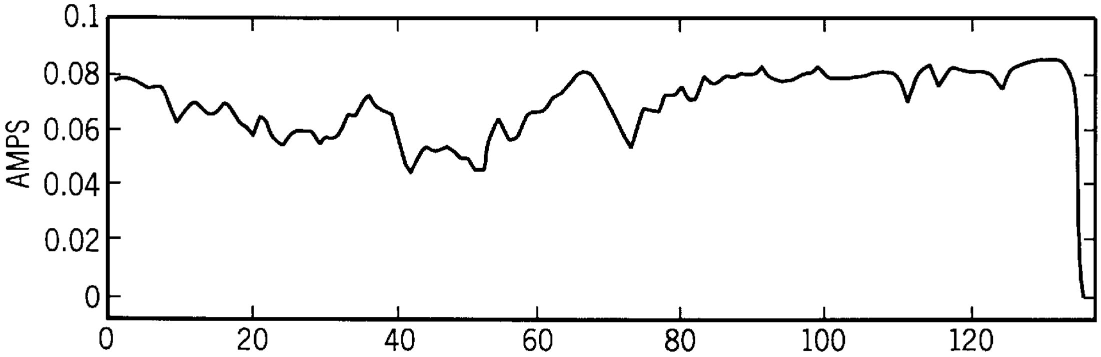
FIG. 15B is an average of the traces in FIG. 15A.
Figure 15C:
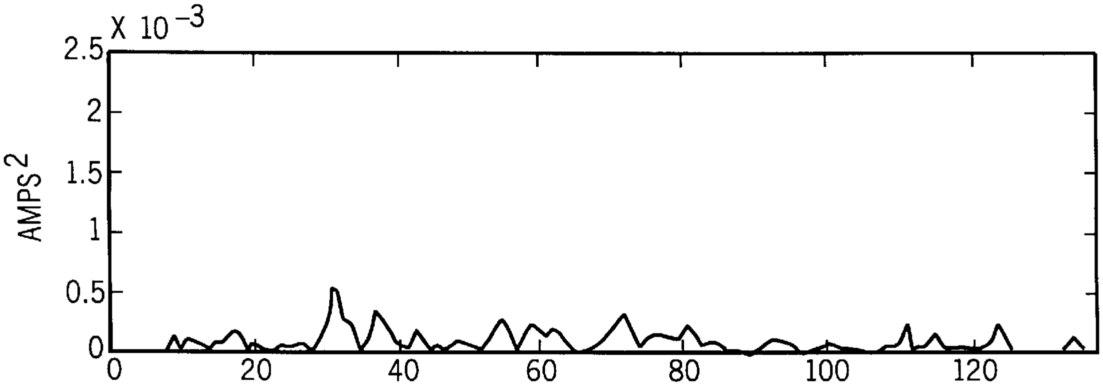
FIG. 15C shows the average variance from the average trace of the different traces of FIG. 15A.

The equalization of battery test data to the reference data from Example V can be accomplished in the same manner as Example II (linear method). FIG. 15A illustrates the results of equalization on the plurality of battery test signals and FIG. 15B is the average signal from the signals of FIG. 15A. FIG. 15C shows the average variance of the battery test signals relative to the reference signal, and the improvement can be noted by comparison to FIG. 14C.

EXAMPLE VII

Figure 16A:
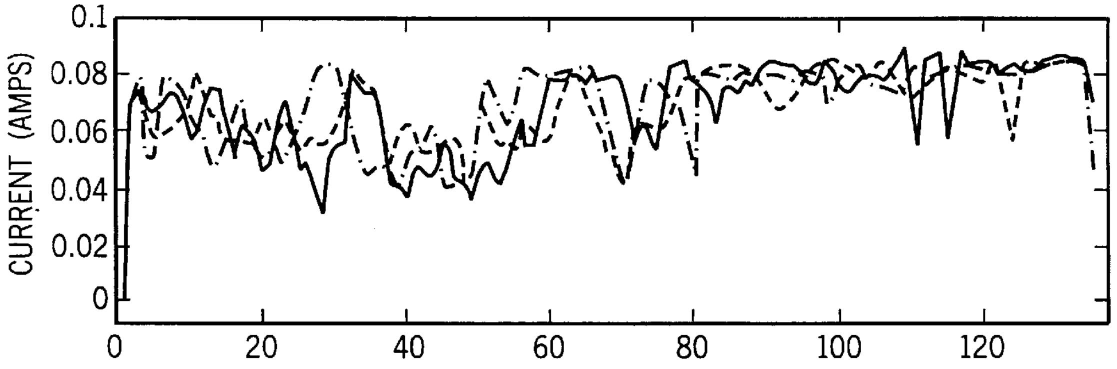
FIG. 16A illustrates the plurality of cardiac signals of FIG. 10A after spline interpolation equalization of signal length.
Figure 16B:
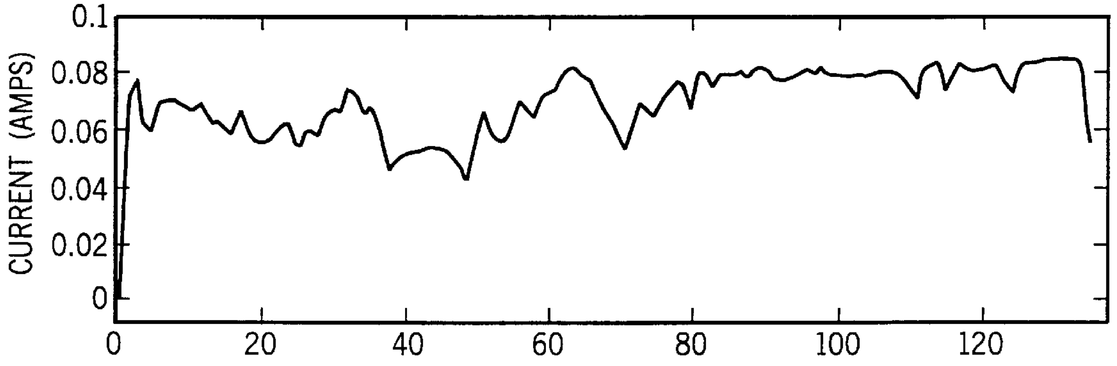
FIG. 16B is an average of the traces in FIG. 16A.
Figure 16C:
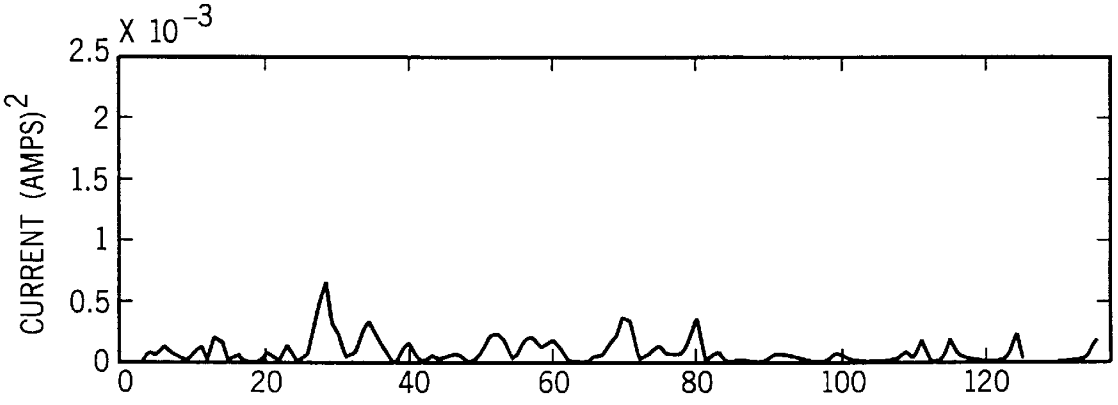
FIG. 16C shows the average variance from the average trace of the different traces of FIG. 16A.

The equalization of battery test data to the reference data from Example V can also be accomplished in the same manner as Example III (spline method). FIG. 16A illustrates the results of equalization on the plurality of battery test signals and FIG. 16B is the average signal from the signals of FIG. 16A. FIG. 16C shows the average variance of the battery test signals relative to the reference signal, and the improvement can be noted by comparison to FIG. 14C.

EXAMPLE VIII

Figure 17A:
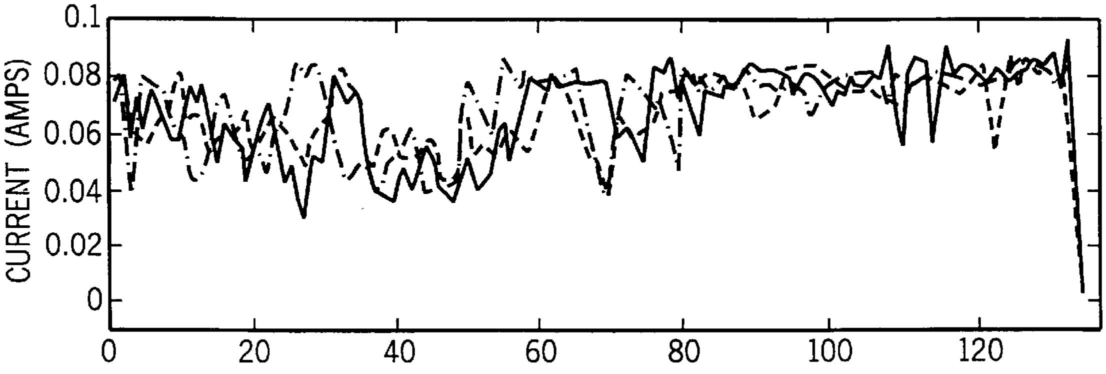
FIG. 17A illustrates the plurality of cardiac signals of FIG. 10A after FFT equalization of signal length.
Figure 17B:
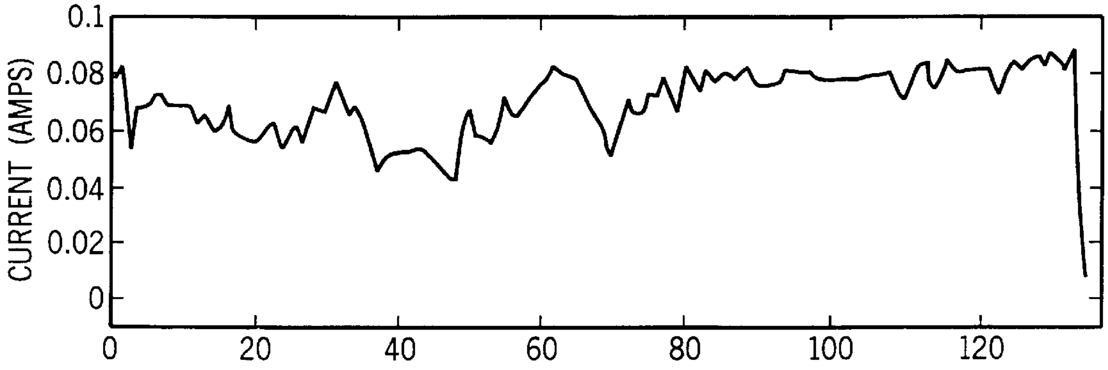
FIG. 17B is an average of the traces in FIG. 17A.
Figure 17C:
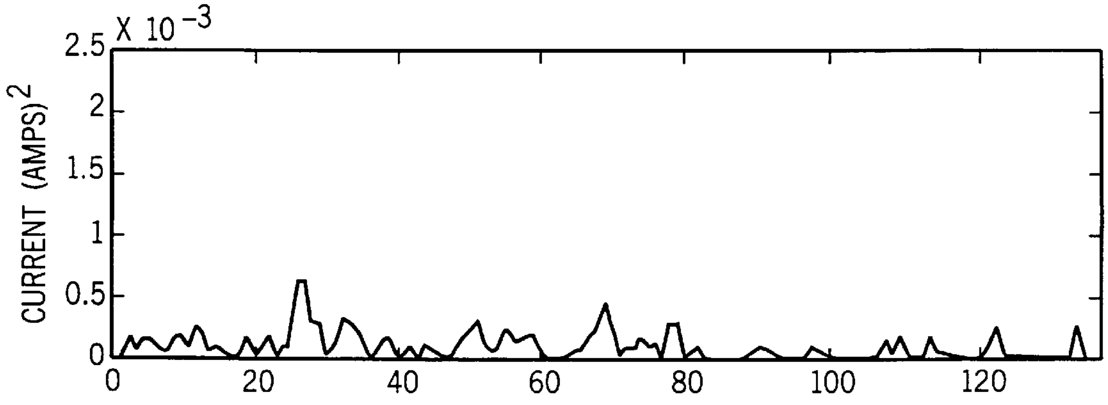
FIG. 17C shows the average variance from the average trace of the different traces of FIG. 17A.

The equalization of battery test data to the reference data from Example V can further be accomplished in the same manner as Example IV (FFT method). FIG. 17A illustrates the results of equalization on the plurality of battery test signals and FIG. 17B is the average signal from the signals of FIG. 17A. FIG. 17C shows the average variance of the battery test signals relative to the reference signal, and the improvement can be noted by comparison to FIG. 14C.

EXAMPLE IX

Figure 9C:
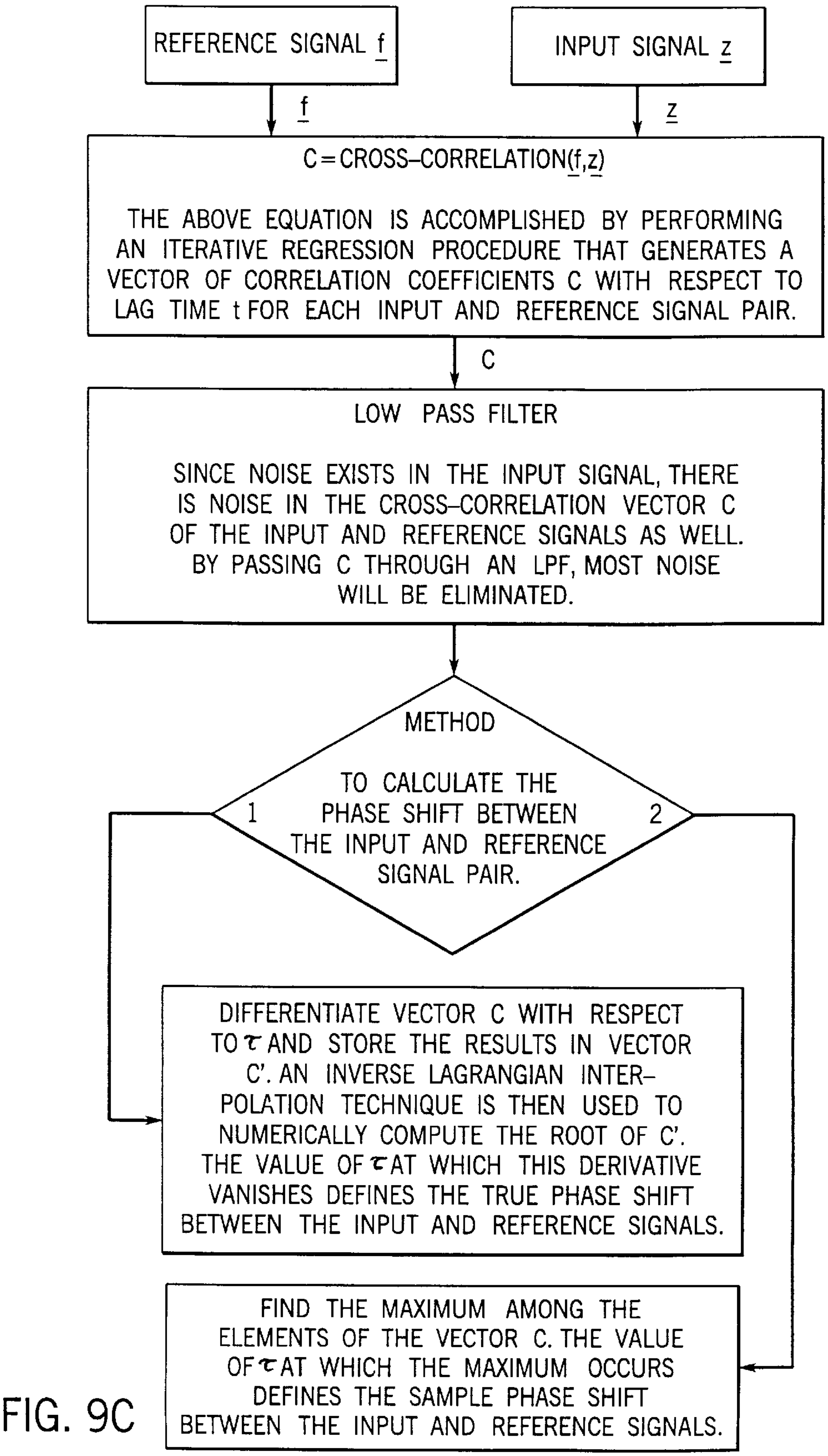

Phase shifting of the cardiac signals of FIG. 10A can be carried out in real time or after data accumulation by performing an iterative regression procedure that generates a vector of correlation coefficients C with respect to lag time $\tau$ for each input and reference signal pair. FIG. 9C illustrates functionally implementation of this process. This vector of correlation coefficients is a unimodal concave function of $\tau$. Once the generation of the correlation coefficients is accomplished, a central-difference technique is applied to differentiate the correlation coefficient vector C with respect to the independent variable $\tau$. The results are stored in a new vector C'. An inverse Lagrangian interpolation technique is then used to numerically compute the root of C'. The value of $\tau$ at which this derivative vanishes defines the true phase shift between the two signals. When the reference and input signals contain large amounts of noise the resulting C vector is also noisy, therefore the discrete differentiation technique cannot be applied directly. To overcome this an FIR (Finite Impulse Response) noise removal filter is first applied to C and then the procedure continues as described.

A computer software Appendix E is attached hereto which describes the implementation of the phase shift iterative regression procedure. This illustrates an example of such a phase shift procedure. An illustration of the effect of this phase shifting can be seen in FIGS. 18A and B which compare cardiac reference and test signals. In FIG. 18A is shown a set of three length equalized cardiac signals before phase optimization. FIG. 18B illustrates the signals of FIG. 18A after phase optimization.

EXAMPLE X

Figure 19A:
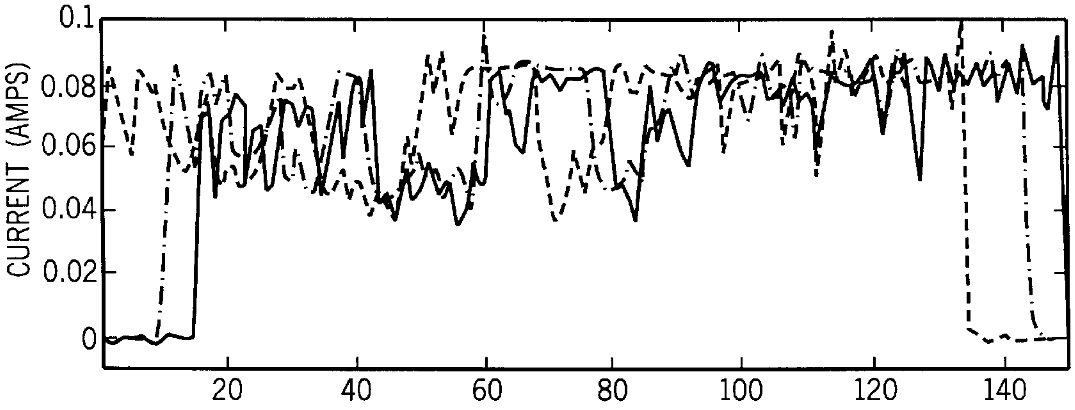
FIG. 19A illustrates battery reference and test data before phase optimization and FIG. 19B is after applying the phase shift optimization.
Figure 19B:
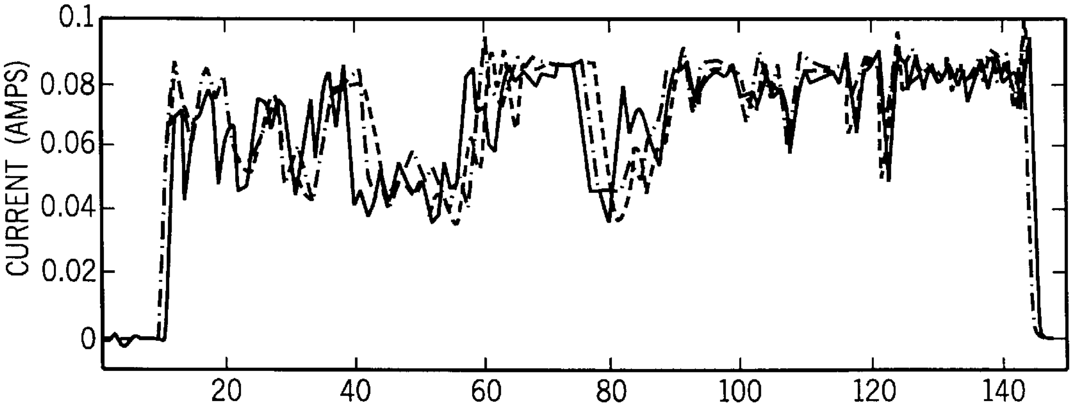

Phase shifting of the battery test signals of FIG. 14A can be carried out in the same manner as in Example IX. An illustration of the effect of this phase shifting can be seen in FIGS. 19A and B which compare battery reference and test data signals. FIG. 19A shows a set of three length equalized battery signals before phase optimization, and FIG. 19B illustrates the signals of FIG. 19A after phase optimization.

While preferred embodiments of the invention have been shown and described, it will be clear to those skilled in the art that various changes and modifications can be made without departing from the invention in its broader aspects as set forth in the claims provided hereinafter.

APPENDIX A

Computer software for Spectrum Transformed Sequential Testing

APPENDIX B

Computer software for linear compression/dilation

APPENDIX C

Computer software for spline compression/dilation method

APPENDIX D

Computer software for FFT compression/dilation method

APPENDIX E

Computer software for phase shift iterative regression procedure

Appendix A

This appendix contains the main source code for the System for Monitoring an Industrial or Biological Process. The decision making kernel, the SPRT, is implemented in this code. All of the default parameter settings for the system are defined at the beginning of the code. The code is written in C and follows ANSI standards.

```
/*                              */
/*   ACCORDION Module  */
/*                              */

/*
     Argonne National Laboratory
     Reactor Analysis Division
     Reactor Simulation and Controls Laboratory
     albert 1. chun

*/
     float *reference;
     float *refprev;

#include <stdio.h>
#include <stdlib.h>
#include <math.h>
#define OUTPUT 1                        /*if false - supresses output*/

#define square(x) x*x                   /*square function*/

#define IDBAD 0                         /*return values*/
#define IDOKAY 1

                                        /*note: tune and change these constants to
desired.*/
#define DRW_SIZE 20                     /*default dynamic reference signal window
size*/
#define CHI_SQUARE_THRESHOLD 500.0      /*default chi square failure threshold*/
#define FAIL_THRESH .2                  /*default decision ratio failure thresho
id*/
#define ALPHA .01                       /*default false alarm probability*/
#define BETA .01                        /*default missed alarm probability*/
#define SFM_CONST 2.0                   /*default smf constant*/

#define REFERENCE_SIGNAL_LENGTH 130     /*default ref
erence signal length */
#define MAX_SIGNAL_LENGTH 260           /*maximum sig
nal length accepted*/
                                        /*note: pulse
lengths that exceed*/
                                        /*this length
are ignored*/
#define MIN_SIGNAL_LENGTH 80            /*minimum sig
nal length accepted*/
#define THRESHOLD .02                   /*minimum pul
as value threshold*/

#define MAX(a,b) (((a) > (b)) 7 (a) : (b))
#define MIN(a,b) (((a) < (b)) 7 (a) : (b))

/* include ACCORDION header file*/
/* . . . . . . . . . . . . . . . . . . . . . . */
/* . . . . . . . global variables . . . . . . . */
/* . . . . . . . . . . . . . . . . . . . . . . */
FILE *fp;                                  /*temporary - generic
file pointer*/
char DATA_INPUT_FILE[13] = "new.dat";      /*temporary - input da
ta signal*/
float *variance;                        /*variance signal*/
float *varprev;                         /*previous variance signal*/
/*reference signal*/
/*previous reference signal*/
int count;                              /*pulse number count*/
float       sprt1,sprt2;
float       thrshA,thrshB;

float       alpha = ALPHA;
            beta = BETA,
            sfm_const = SFM_CONST,
            chi_thresh = CHI_SQUARE_THRESHOLD,
            fail_thresh = FAIL_THRESH;

int         drw_size = DRW_SIZE,
            reference_signal_length = REFERENCE_SIGNAL_LENGTH;

/*define data structure for creating dynamic reference window*/

struct refNode
{
float *data;
struct refNode *nextNode;
}
*newNode, /*new node in list*/
*oldNode; /*oldset node in list*/

/*function prototype*/
void accordion(/*float *data,int signal_length,float *datpt*/);

/* . . . . . . . . . . . . . . . . . . . . . . */
/* . . . . . . DRW functions . . . . . . . . */
/* . . . . . . . . . . . . . . . . . . . . . . */

/* . . . . . . . . . . . . . . . . */
/* stores new signal in DRW - recomputes reference mean*/
/* count <= drw-size - initialization phase */
/* . . . . . . . . . . . . . . . . */
void DRWinit_reference(DATAnew)
```

-continued

```
/*note: uncomment method to use*/

#include "fft.h"
/*include "spline.h"*/
/*include "linear.h"*/
newNods = newNode->nextNode; /*increment newNode*/

for (i = 0; i<reference__signal__length, i++)
{
newNode->data[i] = DATAnew[i];
reference[i] = reference[i] + (DATAnew[i]-reference[i]))/(float)(count
};
   }
}


/* . . . . . . . . . . . . . . . . . . . . . . */
/* recomputes variance - count <= drw__size */
/* . . . . . . . . . . . . . . . . . . . . . . */

void DRWimit__variance(DATAnew)
float *DATAnew;
{
int i;
/*struct refNode *currNode;*/
float delta;
if(count == 1)
{
/*for very first signal*/
for (i = 0, i<reference__signal__length; i++)
{
variance[i] = 0;
refprev[i] = reference[i];
   }
}
else
(/*for subsequent signals (count < drw__size)*/
for(i = 0, i<reference__signal__length, i++)
{
/*recalculate variance*/
delta = reference[i]-refprev[i];
variance[i] = (square((DATAnew[i] - reference[i])) +
(count-2)*variance[i])/(float)(count-1) + squa
re(delta);
refprev[i] = reference[i];
   }
  }
}

/* . . . . . . . . . . . . . . . . . . . . . . */
/* stores new signal in DRW - recomputes reference mean*/
/*count > drw-size - testing phase */
/* . . . . . . . . . . . . . . . . . . . . . . */
float *DATAnew;
{

int i;

    {
    newNode->data[i] = DATAnew[i];
    refprev[i] = reference[i];
    /*assign previous reference*/
    reference[i] = reference[i] + (DATAnew[i]-oldNode->dat
    a[i])/drw__size;
       }
    }
    /* . . . . . . . . . . . . . . . . . . . . . . */
    /* recomputes variance - count <= drw__size */
    /* . . . . . . . . . . . . . . . . . . . . . . */

    void DRWcalc__variance (DATAnew)
    float *DATAnew;
    {

    struct refNode *temp;

    int i;
    float delta;
    for (i = 0, i<reference__signal__length; i++)
       {

    delta = reference[i]-refprev[i];
    variance[i] = variance[i] + (square((DATAnew[i]-reference[i]))-
    2*delta*(drw__size*refprev[i]oldNode->data[i])-square((
    oldNode->data[i] - refprev[i]))
    /(float)(drw__size-1) +2*refprev[i]*delta+square(delta);
    }
    }


    /* . . . . . . . . . . . . . . . . . . . . . . */
    /*create the dynamic reference window */
    /* using first drw__size signals */
    /* . . . . . . . . . . . . . . . . . . . . . . */

    void DRWcreate()
    {

    float data(MAX__SIGNAL__LENGTH);
    float *datapt = (float *)malloc(reference__signal__length*sizeof(float));
    int signal__length;
    int i;
    /*allocates memory for DRW */

    newNode = (struct refNode *)malloc(sizeof(struct refNode));
    newNode->data = (float *)malloc(reference__signal__length*sizeof(float));
```

-continued

```
void DRWcalc__reference(DATAnew)
float *DATAnew;
{
int i;
newNode = oldNode; /*increment newNode*/
oldNode = newNode->nextNode; /*increment oldNode*/

for (i=0; i<reference__signal__length; i++)

newNode->nextNode = oldNode;
oldNode = newNode;

/*initialize reference = 0 */

for (i = 0; i<reference__signal__length; i++)
reference[i] = 0;

printf("Creating Dynamic Reference WIndow . . .\n");

/*fills the DRW with the first drw__size battery signals*/
/*continually recomputes the reference mean and variance*/

while ( (count<drw__size) && ((signal__length = read__data(data))!=IDBAD))
      {
count++;

printf("Battery #%d\n",count);


accordion(data,signal__length,datpt);
DRWimit__reference(datpt);
DRWinit__variance(datopt);
      }
}


/* . . . . . . . . . . . . . . . . */
/* deallocates memory used for the DRW */
/* . . . . . . . . . . . . . . . . */

void DRWfreeNodes()
{
struct refNode *currNode,*temp;

currNode = oldNode;
while(currNode i=newNode)
{ temp = currNode;
currNode = currNode->nextNode;
free(temp->data);
free(temp);
}
free(newNode->data);
oldNode = newNode;

for (i = 0,i<drw__size;i++)
{
newNode->nextNode = (struct refNode *)malloc(sizeof(struct refNode))
newNode = newNode->nextNode;
newNode->data = (float *)malloc(reference__signal__length*sizeof(float)
};
   }
gets(str);
if(!strcmp(str,"")) (printf("using default - %.2f\n",def);return def
;}
  }
while(atof(str)==0); /*checks for valid floating point number*/
return atof(str);
}

/* . . . . . . . . . . . . . . . . */
/*change operating parameters*/
/* . . . . . . . . . . . . . . . . */

void change__parameters()
{
/*change parameters*/
printf("\nONLINE SPRT EXPERT DIAGNOSTIC SYSTEM\n\n");
printf("Change Parameters? (default = n)\n");
if (getchar() == 'y')
{
do
{
{
getchar();
printf("Change Parameters\n");
printf("SPRT TNST\n");
printf("flase alarm probability - alpha (default =%.2f) ",ALPHA);
alpha = getval(ALPHA);
printf("missed alarm probability - beta (default = %.2f) ",BETA);
beta = getval(BETA);

printf("SFM constant (default = %.2f) ",SFM__CONST);
sfm__const = getval(SFM__CONST);
printf("decision ratio failure threshold (default = %.2f) ",FAIL__THRESH);

fail__thresh = getval(FAIL__THRESH);
printf("CHI SQUARE TEST\n");
printf("chi^2 threshold (default = %.2f) ", CHI__SQUARE__THRESHOLD);
chi__thresh = getval(CHI__SQUARE__THRESHOLD);


printf("size of dynamic reference window(DRW) (default = %d)",DRW__SIZE
};
drw__size = getval((float) DRW__SIZE);
printf("reference signal length (default = %d)",REFERENCE__SIGNAL__LENGTH};
```

-continued

```
free(newNode);


/* . . . . . . . . . . . . . . . . . . . . . . */
/* . . . . . . . non testing functions . . . . . . . */
/* . . . . . . . . . . . . . . . . . . . . . . */
/* . . . . . . . . . . . . . . . . . . . . . . */
/*user input function - returns floating point input from keyboard*/
/*in case of <enter> with no input - returns default value */
/* . . . . . . . . . . . . . . . . . . . . . . */

float getval(def)
float def;
{
char str[20];
do
{
/* . . . . . . . . . . */
void initialize()
{
count = 0;

change__parameters();

/* allocate memory*/
variance = (float *)malloc(reference__signal__length*sizeof(float));
varprev = (float *)malloc(reference__signal__length*sizeof(float));
reference = (float *)malloc(reference__signal__length*sizeof(float));
refprev = (float *)malloc(reference__signal__length*sizeof(float));

/*set sprt thresholds*/
thrshA = log ((1.0-beta)/(float)alpha);
thrshB = log (beta/(float)(1.0-alpha));

/*temporary - open data file*/
printf("reading %s\n",DATA__INPUT__FILE);
fp = fopen(DATA__INPUT__FILE,"r∞);
/*create DRW"/
DRWcreate ();
}
/* . . . . . . . . . . */
/*shutdown */
/* . . . . . . . . . . */

void shutdown()
{
printf("shutdown . . .\n");
fclose(fp);
DRWfreeNodes();
}


/* . . . . . . . . . . . . . . . . . . . . . . */
reference__signal__length = getval((float) REFERENCE__SIGNAL__LENGTH);
printf("\n . . . . . . . . . . \n");
printf("\n alpha \t\t%.2f\theta\t\t%.2f \n sfm const\t%.2f\tdrf thresh
\t%.2f\n chi 2 thresh\t%.2f \n";
alpha,beta,sfm__const,fail__length,chi__thresh);
printf("\n reference signal length\t %d\ndynamic reference window(DRN)
size\t %d\n",reference__signal__length,drw__size);
printf(". . . . . . . . . . \n");
printf("\n press 'y' to accept parameters and begin test\n press any other
key to edit parameters\n\n\n");
)while (getchar() !='y');
);
}

/* . . . . . . . . . . */
/*initialization */
/* . . . . . . . . . . */
/*output of test results */

/* . . . . . . . . . . */
void output(a1,a2,b1,b2,ratio1,ratio2,OKFLAG,CHIFLAG,CHISTAT)
int a1,a2,b1,b2,
float,ratio1,ratio2;
int OKFLAG,CHIFLAG;
float CHISTAT;
{

printf("\nTESTING\tBATTERY # %d\n\n",count);
printf("SPRT:\t%s\n\t\t\t POS\t NEG\n",OKFLAG?"OK":"FAILURE"):
printf("\t\t # BAD \t %d\t %d\n",a1,a2);
printf("\t\t # OK \t %d\t %d\n",b1,b2);
printf("\t\t RATIO \t %.4f\t %.4f\n",ratio1,ratio2);
printf("CHI^2;\t%s\t STAT,%.2f\n\n",CHIFLAG?"OK":"FAILURE",CHISTAT);

}

/* . . . . . . . . . . . . . . . . . . . . . . */
/* . . . . . . . . test functions . . . . . . . . */
/* . . . . . . . . . . . . . . . . . . . . . . */

/* . . . . . . . . . . */
/* core sprt function */
/* . . . . . . . . . . */

void sprt (sfm,g,datpt,sprt1,sprt2,a1,b1,a2,b2)
float sfm,g,datpt,*sprt1,*sprt2;
int *a1,*a2,*b1,*b2;
{
/*if alarm then reset sprt indicies to 0*/
if ((*sprt1 == thrshA) | | (*sprt1 == thrshH)) *sprt1 = 0.0;
if ((*sprt2 == thrshA) | | (*sprt2 == thrshH)) *sprt 2 = 0.0;
/*calculate sprts*/
```

-continued

```
/*temp; data is now read from a file, this function needs to be replaced*/
/*by an online data aquisition function, returns signal length when */
/*sucessfull and IDBAD when failure. */
/* . . . . . . . . . . . . . . . . . . . . . */

int read__data(data)
float *data;
{
int i;

do
{
i =0;
if(fscanf(fp,"%f\n",*data[0])==HOF) return IDBAD;

while(data[i]>THRESHOLD)
{
i++;
if(fscanf(fp,"%f\n",*data[i])==HOF) return IDBAD;
}
} while (i<MIN__SIGNAL__LENGTH || i>MAX__SIGNAL__LENGTH);
return i;
}
*chi = 0;
for (i=0;i<reference__signal__length,i++)
{
data__chi = (datapt[i]-reference[i]}/sqrt(variance[i]);
*chi += data__chi*data__chi;
}
if ("chi < chi__thresh) return IDOKAY;
else return IDBAD;
}
/* . . . . . . . . . . */
/* main testing function */
/* . . . . . . . . . . */

void test()
{
float data(MAX__SIGNAL__LENGTH);
int signal__length;
float *datpt = (float *)malloc(reference__signal__length*sizeof(float));
float sfm;
int i;
imt a1,a2,b1,b2; /*sprt alarm count accumulator*/

int OKFLAG; /*SPRT TEST: 0 IF failure, 1 if OKAY*/
int CHIFLAG; /*CHI 2 TEST: 0 IF failure, 1 if OKAY*/
float ratio1; /*sprt decision ratio pos sprt*/
float ratio2; /*sprt decision ratio neg sprt*/
float chistat; /*chi square test statistic*/


printf("\nBegin Testing . . . \n");
```

```
*sprt1 += -g*(sfm/2.0 - datpt);
*sprt2 += -g*(sfm/2.0 + datpt);
/*compare sprt indicies with thresholds*/
/*set alarm and increment accumulator*/
if (*sprt >= thrshA)
(*sprt1 = thrshA, (*a1)++;}
else if (*sprt1 <= thrshH)
(*sprt1 = thrshH; (*b1)++;}
if (*sprt2 >= threshA) (*sprt2 = thrshA;(*a2)++;}
else if (*sprt2 <= thrshH) (*sprt2 = thrshB;(*b2)++;}
}

/* . . . . . . . . . . */
/*chi square enhancement */
/* . . . . . . . . . . */


int chi2(datapt,chi)
float *datapt,*chi;
{
float data__chi;
int i;

if (OKFLAG == IDOKAY && CHIFLAG == IDOKAY)
{
DRWcalc__reference(datpt,reference);
DRWcalc__variance(datpt);
#if OUTPUT
printf("\nTESTING\tBattery # %d OK\n",count);
#endif
}
else
(/*screen output*/
#if OUTPUT
output(a1,a2,b1,b2,ratio1,ratio2,OKFLAG,CHIFLAG,chistat);
#endif
}
count++;
}
}


/* . . . . . . . . . . */
/* main */
/* . . . . . . . . . . */

void main()
{
initialize();
test();
shutdown();
}
```

-continued

```
while (((signal__length = read__data(data))!=IDBAD))
{
/*reset sprt indicies*/
sprt1=0.0;
sprt2=0.0;
a1=0;b1=0;a2=0;b2=0;
/*size signal to reference*/
accordion(data,signal__length,datpt);
/*sprt test*/
for (i=0;i<reference__signal__length,i++)
{
sfm = sfm__const*sqrt(variance[i]);
sprt(sfm,sfm/variance[i],datpt[i] - reference[i],
&sprt1,&sprt2,&a1,&b1,&a2,&b2);
}
ratio1 = a1/(float (a1+b1);
ratio2 = a2/(float (a2+b2);
OKFLAG = (ratio1 > fail__thresh || ratio2 > fail__thresh)?IDBAD:IDOKAY;
/*chi square test*/
CHIFLAG = chi2(datpt,&chistat); /*chi square test*/
/*reference is not updated if sprt test failed */
```

Appendix B

This appendix contains the source code for the linear compression/dilation module used in the System for Monitoring an Industrial or Biological Process. The linear method is one of three user specifiable choices to use for the compression/dilation of the input signals. In the main program this module is accessed via inclusion of a header file named linear.h. The code follows ANSI C standards.

```
/* . . . . . . . . . . . . . . . . . . . . */
/*ACCORDION: linear interpolation header file */
/* . . . . . . . . . . . . . . . . . . . . */
void linear(in,out,datlen,reflen)
float *in,*out;
int datlen,reflen;
{
float inc,index=0,x;
int i,j,n = 0;
inc = datlen/(float) reflen;
out[0] = in[0];
out[reflen] = in[datlen];
printf("AAAA - %d \n\n\n", reflen);
for (n=1;n<reflen;n++)
{
index +=inc;
j = index/1;
x = index − j;
```

-continued

```
out[n] = in[j] + x*(in[j+1]−in[j]);
}
}
/* . . . . . . . . . . . . . . . . . . . . */
/*ACCORDION: expands or dialates signal to reference length */
/* . . . . . . . . . . . . . . . . . . . . */
void accordion(data,signal_length,datpt)
float *data,*datpt;
int signal_length;
{
extern int reference_signal_length;
linear(data,datpt,signal_length,reference_signal_length);
}
```

Appendix C

This appendix contains the source code for the cubic spline compression/dilation module used in the System for Monitoring an Industrial or Biological Process. The cubic spline method is one of three user specifiable choices to use for the compression/dilation of the input signals. In the main program this module is accessed via inclusion of a header file named spline.h. The code follows ANSI C standards.

```
/* . . . . . . . . . . . . . . . . . . . . */
/*ACCORDION: cubic spline interpolation module. */
/* . . . . . . . . . . . . . . . . . . . . */



/* . . . . . . . . . . . . . . . . . . . . */
/* spline - returns interpolation at a point */
/* . . . . . . . . . . . . . . . . . . . . */
float spline(x0, x,y,n,g)
float x0,*x,*y,*g;
int n;
{
/*
This routine returns the cubic spline interpolation at the point x0.
g[*] the table of 2nd derivatives needed for the cubic spline formula
(see the spline0() function);
x[*] and y[*] are the input vectors of x-y data.
All of the vectors are of length n.
It is assumed that the x values are ordered but not necessarily equally space
d.
That is, xin[0] < xin[1] < xin[2] < . . . xin[n−1].
*/

float tmp, dx, xi, xi1, xi1d, xid, y0,
int i, top, bot;
bot = 0; top = n−1;
while (top-bot > 1) ( /* find location in table through bisection *
/
i=(top+bot) >> 1;
if(x[i] <= x0) bot = i;
else top = i;
}

dx = x[top]−x[bot];
xi1 = x[top]−x0;

xi = x0−x[bot];
xi1d = xi1/dx;
xid = xi/dx;
tmp = ( g[bot]*(xi1d*xi1−dx)*xi1 + g[top]*(xid*xi−dx)*xi ]/6.0;
y0 = tmp + y[bot]*xi1d + y[top]*xid;
return y0;
}
```

```
d.
That is, xin[0] < xin[1] < xin[2] < . . . xin[n−1].
*/


static float temp[MAX_SIGNAL_LENGTH);
float, tmp, dx, dx0, dx1, h;
imt i, in1, ip1, j, n1;
ni−n−1;;

g(0) = temp[0] = 0.0;
for (i=1; i<n1; i++) {

ip1 = i+1;
im1 = i−1;
dx = x[i] − x[im1];
dx0 = x[ip1] − x[i];
dx1 = x[ip1] − x[im1];
tmp = dx/dx1;
h = 2.0 + tmp*g[im1];
g[i] = (float) (tmp − 1)/h;
temp[i] = (y[ip1]-y[i])/dx0 - (y[i]-y[im1])/dx;
temp[i] = (temp[i]*6.0/dx1 - tmp*temp[im1])/h;
}
g[n1] = 0.0;
for (j=n−2; j>=0; j−−) g[j] = temp[j] + g[j]*g[j+1];

}
/* . . . . . . . . . . . . . . . . . . . . */
/*ACCORDION: expands or dialates signal to reference length */
/* . . . . . . . . . . . . . . . . . . . . */

void accordion(data,signal_length,datpt)
float *data,*datpt;
int signal_length;
{
extern int reference_signal_length;
float x[MAX_SIGNAL_LENGTH],
deriv[MAX_SIGNAL_LENGTH];
float increment;
int i;

increment = (signal_length-1)/(float) (reference_signal_length-1);

for (i=0;i<signal_length,i++) x[i]=(float)i;
spline0(x,data,signal_length,deriv);
```

-continued

```
/* . . . . . . . . . . . . . . . . . . . . */
/* spline0 - returns 2nd derivatives */
/* . . . . . . . . . . . . . . . . . . . . */

void spline0(x,y,n,g)
float *x,*y,*g;
int n;
{
/*
Routine returns the table of 2nd derivatives needed for the cubic spline
interpolation routine spline(). x[*] and y[*] are the input vectors.
It is assumed that the x values are ordered but not necessarily equally space
for (i=0;i<reference__signal__length;i++)
{

datpt[i] = spline(increment*i,x,data,signal__length,deriv);
}


}
```

Appendix D

This appendix contains the source code for the Fast Fourier Transform (FFT) compression/dilation module used in the System for Monitoring an Industrial or Biological Process. The FFT method is one of three user specifiable choices to use for the compression/dilation of the input signals. In the main program this module is accessed via inclusion of a header file named fft.h. The code follows ANSI C standards.

```
/* . . . . . . . . . . . . . . . . . . . .*/
/*ACCORDION: FFT interpolation module */
/* . . . . . . . . . . . . . . . . . . . .*/

struct comp
{
double r,i;
};

typedef struct comp *Complex__Vector;
Complex__Vector datafft;

extern int count;

/* . . . . . . . . . .*/
/* FFT */
/* . . . . . . . . . .*/

void fftd2(data, n,isign)
Complex__Vector data;
unsigned n;
int isign;
{
/*
subroutine performs an n-point, radix "4+2" Cooley-Tukey fft on complex arr
ay
"data". This routine is about twice as fast as the standard radix-2 approac
h.

n must be a power of two
data[] is the complex input array, and, on exit, it is also the complex
output array (i.e. the input is destroyed)
forward transform ==> isgn=−1
inverse transform ==> isgn=+1

*/

unsigned nmi,ndv2,j,k,l,m,mmax,1max,kmin,kdif,kstep,k1,k2,k3,k4;
double tempr,tempi,theta,wr,wi,wstpr,wstpi,w2r,w2i,w3r,w3i,fn;
double uir,u1i,u2r,u2i,u3r,u3i,u4r,t2r,t2i,t3r,t3i,t4r,t4i;
double pi__M__PI;
unsigned lfft;

/* see if fft length, n, is a power of two */
m = (unsigned) ceil(log((double) n)/0.693147181);
lfft = 2;
for(j=1; j<m; j++) lfft += lfft;

if(lfft i= n) {
printf("FFT LENGTH MUST BE A POWER OF 2\n");
return;
}

/* m = log2 (n) */
        tempi=data[j].i;
        data[j].r=data[r].r;
        data[j].i=data[k].i;
        data[k].r=tempr;
        data[k].i=tempi;
}
m=ndv2;
while (m < j+1) ( j −= m; m >>= 1; )
j += m;
}
ipar=n;
while (ipar > 2) ipar >>= 2;
if (ipar == 2) {
for (k1=0; k1<=nm1; k1+=2) {
k2=k1+1;
tempr=data[k2].r;
tempi=data[k2].i;
data[k2].r=data[k1].r-tempr;
data(k2).i=data[k1].i-tempi;
data[k1].r=data[k1].r+tempr;
data[k1].i=data[k1].i+tempi;
}
}
mmax=2;
while (mmax < n) {
1max=MAX(4,(mmax >> 1));
if(mmax > 2) {
theta=pi__/mmax;
if(isign >= 0) theta=−theta;
wr=cos(theta);
wi=sin(theta);
wstpr=−2.0*wi*wi;
wstpi=2.0*wr*wi;
}
for (1=2; 1<=1max; 1+=d) {
m=1;
if(mmax > 2) {
zero;
w2r=wr*wr−wi*wi;
w2i=2.0*wr*wi;
w3r=w2r*wr−w2i*wi;
w3i=w2r*wi+w2i*wr;
}
kmin=ipar*m; kmin >>= i;
if(mmax <= 2) kmin = 0;
kdif=ipar*mmax; kdif >>= i;
five;
ketep = (kdif << 2);
for (ki=kmin; k1<=nm1; k1+=ketep) {
k2=k1+kdif;
k3=k2+kdif;
k4=k3+kdif;
if(mmax <= 2) {
uir=data[k1]
.r+data[k2].r;
```

-continued

```
nm1=n−1;
wr = wi = wstpr = wstpi = 0.0;
ndv2 = n>>1;
j=0;
for (k=0; k < nmi, k++) {
if (k < j) { /* bit reversal stage */
tempr=data[j].r;
if(isign <
0) {
udr=data[k3].i−data[k4].i;
u4i=data[k4].r-data[k3].r;
goto ten;
}
u4r=data[k4].i-data[k3].i;
w4i=data[k3
].r−data[k4].r;

goto ten;
}
t2r=wr2*data[k2].r-w2i*data[k2].i;
t2i=w2r*data[k2].i+w
2i*data[k2].r;
t3r=wr*data[k3].r−wi*data[k3].i;
t3i=wr*data[k3].i+wi
*data[k3].r;
t4r=w3r*data[k4].r-w3i*data[k4].i;
t4i=w3r*data[k4].i+w
3i*data[k4].r;
u1r=data[k1].r+t2r;
u1i=data[k1].i+t2i;
u2r=t3r+t4r;
u2i=t3i+t4i;
u3r=data[k1].r-t2r;
u3i=data[k1].i-t2i;
if(isign < 0) {
u4r=t3i−tdi

udi=t4r−t3r
goto ten;
}
udr=t4i−t3i;
udi=t3r−t4r;
ten:
data[k1].r=uir+u2r;
data[k1].i=u1i+u2i;
data[k2].r=u3r+u4r;
data[k2].i=u3i+u4i;
data[k3].r=u1r−u2r;
data[k3].i=u1i−u2i;
data[k4].r=u3r−udr;
data[k4].i=u3i−u4i;
}
kmin = (kmin << 2);
kdif = kstep;
if(kdif−n) goto five;
m=mmax−m;
if(isign < 0) {
tempr=wr;
wr=−wi;
wi=−tempr;
goto fifteen;
}
tempr=wr;
wr=wi;
wi=tempr;
fifteen;
if(m > imax) goto zero;
tempr=wr;
u1i=data[k1].i+data[k2].i;
u2r=data[k3]
.r+data[k4].r;
u2i=data[k3].i+data[k4].i;
u3r=data[k1]
.r−data[k2].r;
u3i=data[k1].i−data[k2].i;
wr=wr*wstpr−wi*wstpi+wr;
} wi=wi*wstpr+tempr*wstpi+wi;
ipar=3-ipar;
mmax += mmax;
}
if(isign < 0) return;
fn = 1.0/n;
for (k=0; k < n; k++) ( data[k].r *= fn; data[k].i *= fn;
}
}


/* . . . . . . . . . . . . . . . . . . . .*/
/*ACCORDIONFFT:expands or dialates signal to reference length */
/* . . . . . . . . . . . . . . . . . . . .*/

void accordion(data,signal__length,detpt)
float *data,*datpt;
int signal__length;
{
int i;
float increment, index;
extern int reference__signal__length;

for(i=0,i<signal__length,i++)
{
datafft[i].r =(double) data[i];
datafft[i].i=0.0;
}
for(i=signal__length;i<256;i++)
{
datafft[i].r= 0.0;
datafft[i].i=0.0;
}

/*forward transform*/
fft42(datafft,256,−1);
for(i=256;i<512;i++)
{
datafft[i].r= 0.0;
datafft[i].i= 0.0;
}

/*inverse transform*/
fft42(datafft,512,1);

increment = 2*signal__length/reference__signal__length;
index = 0;
for(i=0,i<reference__signal__length,i++)
{
datpt[i] = (float) datafft[(int)(index+.5)].r;
index += increment;

}



}
```

Appendix E

This appendix contains the code for phase shift optimization module. The code is written as a stand alone program. Therefore, the user has the ability to choose when and if the module should be used. There are two techniques that the user can choose from to achieve phase optimization; one based on cross correlation only, and one that uses a derivatives and cross correlation. The code for this module follows ANSI C standards.

```
/* PHASE SHIFT OPTIMIZATION MODULE */

#include <stdio.h>
#include <math.h>
#include <stdlib.h>
#include <string.h>

#defined pi 3.1415926
#defined N 1024
#define xcsize 2047
#define fil__xcsize 2079
#define filsize 32

void phase__shift__optimization(int argc,char argv[j[20],int method);
void conv(float f[], float g[], float c[], int size),
void der(float y[], float diff[], int size);
void roots(float diffxc[], int size, float *root);
void flip1r(float m[], int size);
void prn__info(char *);
void xmin(int argc, char **argv)
{
int i,method;
char tempargv[10] [20];

if(argc i=5) {
prn__info(argv[0]);
exit(1);
}

for(i=0,i<argc,i++)
stropy(tempargv[i],argv[i]);

printf("Enter 1 or 2 below. (\"1\" means the employment of the");
printf("derivative techique to find the shift, while \"2\"");
printf("means the application of direct max. correlation");
printf{"technique.);\n"};
scanf{"%d",&method);

phase__shift__optimization(argc,tempargv,method);
}



void phase__shift__optimization(int argc, char argv[] [20], int method)
{
int i,j,ph;
float root;
float f1[xcsize],f2[xcsize],b[fil__xcsize];
float xc[fil__xcsize], fil__xc[fil__xcsize];
float difffil__xc(fil__xcsize-1);
FILE "infile1,"infile2,*infile3,"outfile,"outfile1,"outfile2;


/* Open the input and output data files. */

outfile=fopen(argv[4],"w");
}

ph=j-(fil__xcsize+1)/2;
printf("The shift is %d\n",ph);
}
/* Find the shift, using derivative technique. */
if(method==1)
{ der(fil__xc,difffil__xc,fil__xcsize);
root=(difffil__xc,fil__xcsize−1,xroot);
ph=root-(fil__xcsize+1)/2;
printf("The shift is %f\n",ph);
}

/* Phase-equalize the input (f2) relative to reference (f1) */
/* If ph>0, f2 leads f1, if ph<0, f2 lags f1. */
if(ph>0)
{ for(i=ph,i<N,i++)
f2[i−ph] = f2[i];
for(i=N−ph;i<N,i++)
f2[i]=0;
}

if(ph<0)
{ ph= −ph;
for(i=0,i<xcsize,i++)
{ f1[i]=0;
f2[i]=0;
}
for(i=0,i<fil__xcsize;i++)
{ xc[i]=0;
b[i]=0;
fil__xc[i]=0;
}

if((infile1=fopen(argv[1],"r")) == NULL)
{ printf("There is no data file %s!\n", argv[1]);
exit(0);
}
else
{ i=0;
while{(fscanf(infile1,"%f",&f1[i])) i=HOF)
i++;
}
if{(infile2=fopen(argv[2],"r")} == NULL)
{ printf("There is no data file %s!\n", argv[2]};
exit(0);
}
else

{ i=0;
while((fscanf(infile2,"%f",&f2[i])) i=HOF)
i++;
}
if((infile3=fopen(argv[3],"r"]) == NULL)
{ printf("There is no data file %s!\n", argv[3]};
exit(0);
}
else
( i=0;
while((fscanf(infile3,"%f",&b[i])) i=HOF)
i++;
}

/* Calculate the cross-correlation of the input and the */
/* reference signals. */
flip1r(f1,N);
conv(f1,f2,xc,xcsize);

/* To pass xc through a LPF */
conv(b,xc,fil__xc,fil__xcsize);


/* Find the shift, using direct max. correlation technique. */
if(method==2);
( ph=fil__xc[0];
j=0;
for(i=0,i<fil__xcsize;i++)
if(fil__xc[i]>ph)
{ ph=fil__xc[i];
j=i;
n[i]=a[size−i−1];
n[size−i−1]=temp;
   }
}
void der(float y[], float diffy[], int size)
{
int i;
float diff;

for(i=0,i<size−1,i++)
diffy[i] = y[i+1]−y[i];

}

void roots(float diffxc[], int size, float *root)
{
int i,j;
float term;

if(diffxc[0]*diffxc[size−1] > 0)
{ printf("The cross__correlation is not unimodal.\n");
exit(0);
}
else
```

-continued

```
for(i=N−1;i>=ph,i−−)
f2[i] = f2[i−ph];
for(i=0,i<ph,i++)
f2[i]=0;
}

for(i=0,i<N;i++)
fprintf(outfile,"%f\n",f2[i]);


fclose(infile1);
fclose(infile2);
fclose(infile3);
fclose(outfile);
}



void conv(float f[], float g[], float c[], int size)
{
int m,k;

for(k=0;k<size,k++)
{ c[k]=0;
for(m=0;m<=k;m++)
c[k] = c[k]+f[m]*g[k−m];
\}
}
void flip1r(float a[], int size)
{
int i,j;
float temp;
j=floor(size/2);
for(i=0,i<j;i++}
{ temp=a[i];
```

```
{ (*root)=0.0;
for(i=0,i<size−1,i++)
{ term=i;
for(j=0,j<size−i,j++}
if(i−j)>0)
term=term*((−diffxc[j])/(diffxc[i]−diffxc[j]));
(*root) :: (*root) + term;

  }
 }
}


void prn__info(char *pgm__name)
{
printf("\n%s%s%s\n",
"Usage: ", pgm__name, "infile1 infile2 infile3 outfile");
printf("\n");
printf("Note that infile1 & infile2 are reference and input signal");
printf("respectively. infile3 should contain the coefficients of");
printf("the LPF, and outfile receives the phase-equalized input signal.\n");
}
```

What is claimed is:

1. A method for monitoring an industrial testing process, comprising the steps of:

(a) providing to a data acquisition system a set of industrial testing signals over a time length and a reference signal over another time length, said industrial testing signals and said reference signal being aperiodic within said time lengths;

(b) adjusting the time length of the industrial signals to the time length of the reference signal, forming a difference between the time length adjusted industrial signals and the reference signal; and (c) outputting the difference between the time length adjusted testing signals and the reference signal for variance minimization and repeating steps (b) and (c) until achieving a minimum variance.

2. The method as defined in claim 1 wherein said set of industrial signals comprises signals from a biological process.

3. The method as defined in claim 1 wherein said set of industrial signals comprises signals from a battery functionality test.

4. The method as defined in claim 1 wherein said set of industrial signals comprises repetitive industrial operational signals.

5. The method as defined in claim 4 wherein said set of industrial signals comprises repeated sensor signals from an avionics system.

6. The method as defined in claim 4 wherein said set of industrial signals comprises repeated electronic sensor signals from testing of a manufactured solid-state device.

7. The method as defined in claim 1 further including the step of performing a SPRT analysis.

8. The method as defined in claim 7 further including the step of responding to the SPRT analysis to modify the industrial process.

9. A method for monitoring an industrial process, comprising the steps of:

(a) providing to a data acquisition system a set of industrial signals over a time length and a reference signal over another time length, said industrial signals and said reference signal being aperiodic within said time lengths;

(b) adjusting the time length of the industrial signals to the time length of the reference signal;

(c) performing a phase shift optimization of the industrial signals relative to the reference signal; and (d) outputting for analysis the difference between the time adjusted and phase shift optimized industrial signals and determining a minimum variance for the difference.

10. The method as defined in claim 9 wherein the time length adjustment is performed on at least a portion of the industrial signal.

11. The method as defined in claim 9 wherein the phase shift optimization step comprises determining a vector cross correlation function, performing a low-pass filtration of the cross correlation function, and calculating a phase shift between the industrial signals and the reference signal.

12. The method as defined in claim 11 wherein said step of calculating a phase shift comprises differentiating the vector cross correlation function with respect to a lag time for each of the industrial signals and the reference signal pairwise performing an inverse Lagrangian interpolation technique by determining the value of the lag time at which the derivative vanishes to define a phase shift correction.

13. The method as defined in claim 11 wherein said step of calculating a phase shift comprises finding a maximum among elements of the vector cross correlation function.

14. An apparatus for monitoring an industrial process, comprising:

(a) means for providing to a data acquisition system a set of aperiodic industrial signals within a time length and an aperiodic reference signal over another time length;

(b) means for adjusting the time length of the industrial signals to the another time length of the reference signal; and (c) means for outputting the time length adjusted industrial signals for achieving a minimum variance of the difference between the industrial signal and the reference signal.

15. The apparatus as defined in claim 14 further including means for performing phase shift optimization of the industrial signals relative to the reference signal and said step of outputting comprising outputting the phase shift optimized and the time length adjusted industrial signals.

16. The apparatus as defined in claim 15 further including means for performing SPRT analysis on the output time length adjusted and phase shift optimized industrial signals.

* * * * *